(12) United States Patent
Wallace et al.

(10) Patent No.: US 8,373,672 B2
(45) Date of Patent: Feb. 12, 2013

(54) ONE SIDED THIN FILM CAPACITIVE TOUCH SENSORS

(75) Inventors: Michael Wallace, Vancouver, WA (US); Philip T. Odom, Vancouver, WA (US)

(73) Assignee: Pure Imagination, LLC, Vancouver, WA (US)

( * ) Notice: Subject to any disclaimer, the term of this patent is extended or adjusted under 35 U.S.C. 154(b) by 98 days.

(21) Appl. No.: 13/104,878

(22) Filed: May 10, 2011

(65) Prior Publication Data

US 2011/0272260 A1 Nov. 10, 2011

Related U.S. Application Data

(60) Provisional application No. 61/333,195, filed on May 10, 2010.

(51) Int. Cl.
*G06F 3/044* (2006.01)

(52) U.S. Cl. .................... 345/173; 345/174; 200/600

(58) Field of Classification Search .............. 200/600; 345/173, 174
See application file for complete search history.

(56) References Cited

U.S. PATENT DOCUMENTS

| | | | |
|---|---|---|---|
| 4,213,367 A | 7/1980 | Moog | |
| 4,299,041 A | 11/1981 | Wilson | |
| 4,852,443 A | 8/1989 | Duncan et al. | |
| 5,129,654 A | 7/1992 | Bogner | |
| 5,188,368 A | 2/1993 | Ryan | |
| 5,413,518 A | 5/1995 | Lin | |
| 5,538,430 A | 7/1996 | Smith | |
| 5,645,432 A | 7/1997 | Jessop | |
| 5,853,327 A | 12/1998 | Gilboa | |
| 6,168,158 B1 | 1/2001 | Bulsink | |
| 6,661,239 B1 | 12/2003 | Ozick | |
| 6,819,316 B2 | 11/2004 | Schulz | |
| 7,242,393 B2 | 7/2007 | Caldwell | |
| 7,276,917 B2 | 10/2007 | Deangelis et al. | |
| 7,301,351 B2 | 11/2007 | Deangelis et al. | |
| 7,368,921 B2 | 5/2008 | Deangelis et al. | |
| 7,395,717 B2 | 7/2008 | DeAngelis et al. | |
| 7,408,109 B1 | 8/2008 | Freitas | |
| 7,439,962 B2 | 10/2008 | Reynolds et al. | |
| 7,465,869 B1 | 12/2008 | Freitas | |
| 7,477,242 B2 | 1/2009 | Cross | |

(Continued)

FOREIGN PATENT DOCUMENTS

| JP | 2007-324088 A | 12/2007 |
|---|---|---|
| KR | 10-2007-0032924 A | 3/2007 |

(Continued)

OTHER PUBLICATIONS

Novacentrix, "MetalonTMConductiveInksforPrintedElectronics", http://www.novacentrix.com/images/downloads/InkBrochure2008revb.pdf, Apr. 11, 2009.

(Continued)

*Primary Examiner* — Gary F. Paumen
(74) *Attorney, Agent, or Firm* — Rylander & Associates, PC; Philip R. M. Hunt; Kurt M. Rylander

(57) ABSTRACT

Thin film capacitive touch sensors and applications thereof are described herein. Embodiments include construction of one-sided and two-sided thin film capacitive touch sensors with partial fill patterns, one-sided thin film capacitive touch sensors including conductive ground plane layers, one-sided thin film capacitive touch sensors including air gap layers, one-sided thin film capacitive touch sensors including a combination of both separation layers to create air gap layers and conductive ground plane layers.

14 Claims, 25 Drawing Sheets

U.S. PATENT DOCUMENTS

| | | | |
|---|---|---|---|
| 7,578,195 B2 | 8/2009 | DeAngelis et al. | |
| 7,737,953 B2 * | 6/2010 | Mackey | 345/173 |
| 7,784,366 B2 | 8/2010 | Daverman et al. | |
| 7,932,898 B2 * | 4/2011 | Philipp et al. | 345/174 |
| 8,044,665 B2 * | 10/2011 | Joutsenoja et al. | 324/457 |
| 2006/0038791 A1 * | 2/2006 | Mackey | 345/173 |
| 2007/0031161 A1 | 2/2007 | Iandoli | |
| 2007/0062739 A1 * | 3/2007 | Philipp et al. | 178/18.06 |
| 2007/0229464 A1 | 10/2007 | Hotelling et al. | |
| 2008/0236374 A1 | 10/2008 | Kramer et al. | |
| 2008/0238433 A1 | 10/2008 | Joutsenoja et al. | |
| 2008/0238448 A1 | 10/2008 | Moore et al. | |
| 2008/0238706 A1 | 10/2008 | Kenwright | |
| 2009/0260508 A1 | 10/2009 | Elion | |
| 2009/0309303 A1 | 12/2009 | Wallace et al. | |
| 2009/0315258 A1 | 12/2009 | Wallace et al. | |
| 2010/0079153 A1 * | 4/2010 | Maloof et al. | 324/658 |
| 2010/0117660 A1 | 5/2010 | Douglas et al. | |
| 2010/0231555 A1 * | 9/2010 | Mackey | 345/174 |
| 2010/0244809 A1 * | 9/2010 | Joutsenoja et al. | 324/72 |
| 2010/0244810 A1 * | 9/2010 | Joutsenoja et al. | 324/72 |
| 2011/0197333 A1 | 8/2011 | Liotta | |
| 2011/0197334 A1 | 8/2011 | Liotta | |
| 2011/0197742 A1 | 8/2011 | Liotta | |
| 2011/0199333 A1 * | 8/2011 | Philipp et al. | 345/174 |
| 2012/0019475 A1 | 1/2012 | Li et al. | |
| 2012/0024132 A1 | 2/2012 | Wallace et al. | |

FOREIGN PATENT DOCUMENTS

| | | |
|---|---|---|
| KR | 10-2007-007248 A | 7/2007 |
| WO | 2011/143260 A2 | 11/2011 |
| WO | 2011/160038 A2 | 12/2011 |
| WO | 2012/015964 A2 | 2/2012 |
| WO | 2012/116233 A2 | 8/2012 |

OTHER PUBLICATIONS

Hwan, Written Opinion of the International Searching Authority PCT/US2011/035980, Jan. 2, 2012, ISA/KR, Republic of Korea.

Lee, Written Opinion of the International Searching Authority PCT/US2011/040913, Feb. 9, 2012, ISA/KR, Republic of Korea.

Lee, Written Opinion of the International Searching Authority PCT/US2011/045598, Feb. 17, 2012, ISA/KR, Republic of Korea.

Kim, Written Opinion of the International Searching Authority PCT/US2012/026401, Feb. 23, 2012, ISA/KR, Republic of Korea.

Andrew R. Millikin, Office Action on U.S. Appl. No. 12/192,257, mailed Jun. 6, 2012, USPTO, US.

Jianchun Qin, Office Action on U.S. Appl. No. 13/163,401, mailed Sep. 18, 2012, USPTO, US.

* cited by examiner

ONE SIDED THIN FILM CAPACITIVE TOUCH SENSORS

CROSS-REFERENCE TO RELATED APPLICATION

The present application claims the benefit of and priority to U.S. Provisional Application No. 61/333,195 filed on May 10, 2010, incorporated herein by reference.

FIELD OF THE INVENTION

The present invention relates to capacitive touch sensors. More particularly, the present invention relates to one-sided thin film capacitive touch sensors.

BACKGROUND

Capacitive touch sensors are known and ubiquitous. Their basic operation is relatively simple. A capacitive touch sensor typically is a small capacitor enclosed in an electrical insulator. The capacitor is a device that has an ability to store an electrical charge, referred to as capacitance. When a power source applies an increased voltage across the capacitor, electrical charges flow into the capacitor until the capacitor is charged to the increased voltage. Similarly, when the power source applies a decreased voltage the capacitor, electrical charges flow out of the capacitor until the capacitor is discharged to the decreased voltage. The amount of time it takes for the capacitor to charge or discharge is dependent on the change in voltage applied and the capacitance of the capacitor. Thus if the capacitance is unknown, it can calculated from the charge or discharge time and the change in voltage applied. A person touching or coming close to a capacitive touch sensor can change the sensor's effective capacitance by combining the person's capacitance with the capacitance of the capacitive touch sensor. This change in effective capacitance can be detected by a change in the charge or discharge times.

Most common capacitive touch sensors, such as those used in cell phones and ATMs are made on inflexible substrates several millimeters thick and protected by glass. Thin film capacitive touch sensors are known, such as those taught in U.S. Pat. No. 6,819,316 "Flexible capacitive touch sensor." However, thin film capacitive touch sensors not used as much due to several technical challenges, including a "two-sided" effect that makes thin film capacitive touch sensors sensitive to touch on both sides of the sensor.

A recent proliferation of inexpensive computer processors and logic devices has influenced games, toys, books, and the like. For example, some kinds of games, toys, and books use embedded sensors in conjunction with control logic coupled to audio and/or visual input/output logic to enrich the interactive experience provided by the game, toy, book, or the like. An example is a book or card (e.g., greeting card) that can sense the identity of an open page or card and provide auditory feedback to the reader relevant to the content of the open page or card.

Many conventional stand-alone computer games provide a visual display of game activity through an electronic display system such as a pixilated flat panel display. Such displays lack the three-dimensional character and physical interaction inherent in typical board-based games. For example, a conventional board game may use of one or more movable playing pieces integral to the action of the game. Conversely, conventional board games often lack the audio and/or visual interaction and computerized game play offered by computer games.

A number of prior art patents have described games (e.g., board games), toys, books, and cards that utilize computers and sensors to detect human interaction with elements of the board games, toys, books, and cards. The following represents a list of known related art:

| Reference: | Issued to: | Date of Issue/Publication: |
| --- | --- | --- |
| U.S. Pat. No. 5,645,432 | Jessop | Jul. 8, 1997 |
| U.S. Pat. No. 5,538,430 | Smith et al. | Jul. 23, 1996 |
| U.S. Pat. No. 4,299,041 | Wilson | Nov. 10, 1981 |
| U.S. Pat. No. 6,955,603 | Jeffway, Jr. et al | Oct. 18, 2005 |
| U.S. Pat. No. 6,168,158 | Bulsink | Jan. 2, 2001 |
| U.S. Pat. No. 5,853,327 | Gilboa | Dec. 29, 1998 |
| U.S. Pat. No. 5,413,518 | Lin | May 9, 1995 |
| U.S. Pat. No. 5,188,368 | Ryan | Feb. 23, 1993 |
| U.S. Pat. No. 5,129,654 | Bogner | Jul. 14, 1992 |

The teachings of each of the above-listed citations (which does not itself incorporate essential material by reference) are herein incorporated by reference. None of the above inventions and patents, taken either singularly or in combination, is seen to describe an embodiment or embodiments of the instant invention described below and claimed herein.

For example, U.S. Pat. No. 5,853,327 "Computerized Game Board" describes a system that automatically senses the position of toy figures relative to a game board and thereby supplies input to a computerized game system. The system requires that each game piece to be sensed incorporate a transponder, which receives an excitatory electromagnetic signal from a signal generator and produces a response signal that is detected by one or more sensors embedded in the game board. The complexity and cost of such a system make it impractical for low-cost games and toys.

U.S. Pat. No. 5,129,654 "Electronic Game Apparatus," U.S. Pat. No. 5,188,368 "Electronic Game Apparatus," and U.S. Pat. No. 6,168,158 "Device for Detecting Playing Pieces on a Board" all describe systems using resonance frequency sensing to determine the position and/or identity of a game piece. Each system requires a resonator circuit coupled with some particular feature of each unique game piece, which increases the complexity and cost of the system while reducing the flexibility of use.

U.S. Pat. No. 5,413,518 "Proximity Responsive Toy" describes another example of a toy incorporating automatic sensing that utilizes a capacitive sensor coupled to a high frequency oscillator, whereby the frequency of the oscillator is determined in part by the proximity of any conductive object (such as a human hand) to the capacitive sensor. This system has the disadvantages of requiring specialized electronic circuitry that may limit the number of sensors that can be simultaneously deployed.

U.S. Pat. No. 6,955,603 "Interactive Gaming Device Capable of Perceiving User Movement" describes another approach to sensing player interaction by using a series of light emitters and light detectors to measure the intensity of light reflected from a player's hand or other body part. Such a system requires numerous expensive light emitters and light detectors, in particular for increasing the spatial sensitivity for detection.

U.S. Pat. No. 5,645,432 "Toy or Educational Device" describes a toy or educational device that includes front and back covers, a spine, a plurality of pages, a plurality of pressure sensors mounted in the front and back covers and a sound generator connected to the pressure sensors. The pressure sensors are responsive to the application of pressure to an aligned location of a page overlying the corresponding cover for actuating the sound generator to generate sounds associated with both the location of the sensor which is depressed and the page to which pressure is applied.

U.S. Pat. No. 5,538,430 "Self-reading Child's Book" describes a self-reading electronic child's book that displays a sequence of indicia, such as words, and has under each indicia a visual indicator such as a light-emitting diode with the visual indicators being automatically illuminated in sequence as the child touches a switch associated with each light-emitting diode to sequentially drive a voice synthesizer that audibilizes the indicia or word associated with the light and switch that was activated.

U.S. Pat. No. 4,299,041 "Animated Device" describes a device in the form of a greeting card, display card, or the like, for producing a visual and/or a sound effect that includes a panel member or the like onto which is applied pictorial and/or printed matter in association with an effects generator, an electronic circuit mounted on the panel member but not visible to the reader of the matter but to which the effects generator is connected, and an activator on the panel member, which, when actuated, causes triggering of the electronic circuit to energize the effects generator.

Each of the prior art patents included above describes a game, toy, book, and/or card that requires expensive components or manufacturing techniques and/or exhibits limited functionality. As will be described below, embodiments of the present invention overcome these limitations

SUMMARY AND ADVANTAGES

Embodiments of a touch sensitive sensor system are described herein, comprising a capacitive touch sensor layer, a separation layer adjacent the capacitive touch sensor layer, and a conductive ground plane layer adjacent the separation layer to shield a backside of the capacitive touch sensor layer. An alternate embodiment is a touch sensitive sensor system comprising a capacitive touch sensor layer and separation layer to create an air gap layer adjacent the capacitive touch sensor layer to shield a backside of the capacitive touch sensor layer.

The system and method for thin capacitive touch sensors of the present invention present numerous advantages, including: (1) inexpensive and simple construction; (2) substantially one-sided triggering of the capacitive touch sensors in particular for hand-held devices; (3) thin construction; (4) touch sensing application to games, board games, toys, books, and greeting cards; and (5) integration of printed art on a layer or substrate with the capacitive touch sensors.

Additional advantages of the invention will be set forth in part in the description which follows, and in part will be obvious from the description, or may be learned by practice of the invention. The advantages of the invention may be realized and attained by means of the instrumentalities and combinations particularly pointed out in the appended claims. Further benefits and advantages of the embodiments of the invention will become apparent from consideration of the following detailed description given with reference to the accompanying drawings, which specify and show preferred embodiments of the present invention.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

REFERENCE NUMBERS USED IN DRAWINGS

Figure 1:
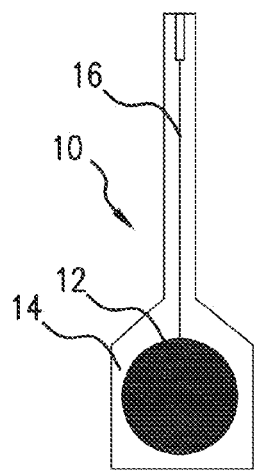
FIGS. 1-4 illustrate several embodiments of thin film capacitive touch sensors with different fill patterns.

In the drawings, similar reference characters denote similar elements throughout the several figures. With regard to the reference numerals used, the following numbering is used throughout the various drawing figures:

| | |
|---|---|
| 10 | thin film capacitive touch sensor |
| 12 | capacitive element |
| 14 | thin film substrate |
| 16 | interconnect |
| 20 | 50% fill pattern capacitive touch sensor |
| 22 | 50% fill pattern capacitive element |
| 30 | 35% fill pattern capacitive touch sensor |
| 32 | 35% fill pattern capacitive element |
| 34 | thin film capacitive touch sensor |
| 36 | capacitive field |
| 42 | printed art layer |
| 44 | capacitive touch sensor layer |
| 46 | capacitive elements |
| 48 | thin film substrate |
| 52 | printed art layer |
| 54 | capacitive touch sensor layer |
| 56 | capacitive elements |
| 58 | thin film substrate |
| 60 | one-sided thin film capacitive touch sensor |
| 62 | conductive ground plane layer |
| 64 | capacitive touch sensor layer |
| 66 | separation layer |
| 70 | one-sided thin film capacitive touch sensor |
| 71 | capacitive elements |
| 72 | conductive ground plane layer |
| 74 | capacitive touch sensor layer |
| 76 | separation layer |
| 78 | thin film |
| 80 | electronics |
| 90 | book |
| 91 | pages |
| 92 | front cover |
| 94 | back cover |
| 95 | capacitive touch sensor layer |
| 96 | conductive ground plane layer |
| 98 | electronics package |
| 100 | book |
| 102 | thin film capacitive touch sensors |
| 104 | back cover |
| 105 | inside surface |
| 106 | conductive ground plane layers |
| 107 | outside surface |
| 108 | front cover |
| 110 | inside surface |
| 112 | outside surface |
| 114 | electronics package |
| 120 | board game |
| 122 | printed art layer |
| 124 | capacitive touch sensor layer |
| 126 | separation layer |
| 128 | conductive ground plane layer |
| 129 | game board back wrap |
| 130 | interactive board game |
| 132 | printed art layer |
| 134 | thin film capacitive touch sensors |
| 136 | separation layer |
| 138 | conductive ground plane layer |
| 140 | doll house |
| 142 | capacitive touch sensor layer |
| 144 | conductive ground plane layer |
| 145 | floor |
| 146 | walls |
| 148 | separation layer |
| 149 | printed outside wall decorative layer |
| 150 | greeting card |
| 152 | printed art layer |
| 154 | capacitive touch sensor layer |
| 155 | separation layer |
| 156 | conductive ground plane layer |
| 157 | card backing layer |
| 158 | electronics package |
| 160 | greeting card |
| 162 | printed art layer |
| 164 | capacitive touch sensor layer |
| 165 | separation layer |
| 166 | conductive ground plane layer |
| 167 | card backing layer |
| 168 | electronics package |
| 170 | one-sided thin film capacitive touch sensor |
| 172 | capacitive touch sensor layer |
| 174 | separating base |
| 176 | air gap layer |
| 180 | one-sided thin film capacitive touch sensor |
| 182 | capacitive touch sensor layer |
| 184 | separating base |
| 186 | air gap layer |
| 190 | one-sided thin film capacitive touch sensor |
| 192 | capacitive touch sensor layer |
| 194 | thick separating material |
| 200 | one-sided thin film capacitive touch sensor |
| 202 | capacitive touch sensor layer |
| 204 | corrugated structure |
| 206 | air gap layer |
| 220 | capacitive guitar |
| 222 | guitar body |
| 224 | neck conductive ground plane layer |
| 226 | neck housing |
| 228 | guitar neck |
| 230 | body conductive ground plane layer |
| 232 | body separation layer |
| 234 | printed art layer |
| 236 | capacitive touch sensor layer |
| 238 | electronics package |
| 239 | speaker |
| 240 | capacitive drum set |
| 242 | printed art layer |
| 244 | capacitive touch sensor layer |
| 246 | plastic drum platform |
| 248 | conductive ground plane layer |
| 250 | electronics package |
| 252 | speaker |
| 260 | book |
| 261 | pages |
| 262 | front cover |
| 264 | back cover |
| 265 | capacitive touch sensor layer |
| 266 | lattice structure |
| 268 | lattice backing |
| 269 | electronics package |
| 270 | interactive board game |
| 272 | printed art layer |
| 274 | capacitive touch sensor layer |
| 276 | separating base |
| 280 | doll house |
| 282 | capacitive touch sensor layers |
| 284 | separation base |
| 285 | floor |
| 286 | interior walls |
| 288 | separation layer |
| 289 | outside decorative walls |
| 290 | capacitive drum set |
| 292 | printed art layer |
| 294 | capacitive touch sensor layer |
| 296 | plastic drum platform |
| 298 | separation base |
| 300 | electronics package |
| 302 | speaker |
| 310 | greeting card |
| 312 | printed art layer |
| 314 | capacitive touch sensor layer |
| 316 | separation base |
| 317 | card backing layer |
| 318 | electronics package |
| 320 | greeting card |
| 322 | pop-up |
| 324 | card top |
| 326 | card bottom |
| 328 | air gap layer |
| 330 | printed art layer |
| 332 | capacitive touch sensor layer |
| 334 | electronics package |

-continued

| 340 | capacitive guitar |
| --- | --- |
| 342 | guitar body |
| 344 | air gap layer |
| 346 | neck housing |
| 348 | guitar neck |
| 350 | conductive ground plane layer |
| 352 | body separation layer |
| 354 | printed art layer |
| 356 | capacitive touch sensor layer |
| 358 | electronics package |
| 359 | speaker |

DETAILED DESCRIPTION

Before beginning a detailed description of the subject invention, mention of the following is in order. When appropriate, like reference materials and characters are used to designate identical, corresponding, or similar components in differing figure drawings. The figure drawings associated with this disclosure typically are not drawn with dimensional accuracy to scale, i.e., such drawings have been drafted with a focus on clarity of viewing and understanding rather than dimensional accuracy.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

FIGS. 1-26B illustrate several embodiments of thin film capacitive touch sensors and several embodiments of applications thereof. FIGS. 1-8 generally describe the construction of two-sided thin film capacitive touch sensors. FIGS. 7-18B generally describe one-sided thin film capacitive touch sensors with conductive ground plane layers. FIGS. 19A-26B generally describe one-sided thin film capacitive touch sensors with air gap layers. The relative low cost and simplicity/elegance of these thin film capacitive touch sensors enable games (e.g., board games), toys (e.g., musical instruments such as guitars and drums), books, and greeting cards to include touch sensitive functionality. The games, toys, books, and greeting cards described herein include one-sided thin film capacitive touch sensors including both conductive ground plane layers and air gap layers.

Many existing sample capacitive design kits available from manufacturers use printed circuit boards to create and connect thin film capacitive touch sensors. This approach is too expensive and cumbersome for most low-cost (e.g., game, toy, book, and greeting card, among others) applications. A low-cost alternative is to manufacture thin film capacitive touch sensors (thin compared to printed circuit boards). One method of manufacturing thin film capacitive touch sensors is to print the elements of the capacitors with conductive ink onto a thin film substrate using a screen printing technique. The thin film substrate may be a sheet of material like plastic (e.g., polyester) or paper. In addition to being lower cost than a printed circuit board, thin film substrates such as polyester or paper are more flexible.

FIGS. 1-4 illustrate several embodiments of thin film capacitive touch sensors with different fill patterns. FIG. 1 shows a thin film capacitive touch sensor 10 with a solid fill pattern. The thin film capacitive touch sensor 10 has a thin film substrate 14 and a capacitive element 12. The capacitive element 12 is made of conductive ink deposited without porosity on the thin film substrate 14, giving it a solid fill pattern. In this embodiment, the conductive ink is deposited using a screen printing technique, but in other embodiments, other techniques may be used. The thin film capacitive touch sensor 10 also has an interconnect 16, configured to electrically connect the capacitive element 12 to circuits outside of the thin film capacitive touch sensor 10. In this embodiment, the interconnect 16 is also conductive ink deposed on the thin film substrate 14. Capacitive elements and interconnects are collectively referred to herein as "conductive pathways."

The conductive ink used generally includes a polymer and a metal and/or carbon conductive material. For example, the polymer may include powdered and/or flaked silver, gold, copper, nickel, and/or aluminum. In some embodiments, the conductive pathways range from less than 100 Ohms to 8K Ohms resistance, depending on their material composition and configuration. Conductive ink with less conductive material may be less expensive, but may exhibit greater resistivity. Conductive ink with a greater amount of conductive material may be more expensive, but may exhibit decreased resistivity.

The cost of capacitive touch sensors may be mitigated by substituting the capacitive element 12 with the solid fill pattern shown in FIG. 1 with a capacitive element having a partial fill pattern, resulting in a partial fill pattern capacitive touch sensor. The partial fill pattern capacitive element is porous, resulting in an area of thin film substrate under the partial fill pattern capacitive element having less than complete conductive ink coverage. However, the partial fill pattern capacitive element is continuous, so that electrical charges can flow to all parts of the element.

Figure 2:
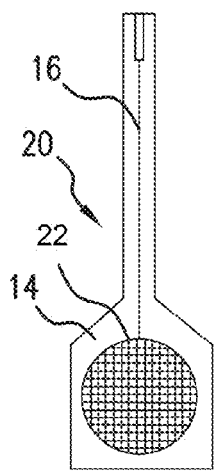
Figure 3:
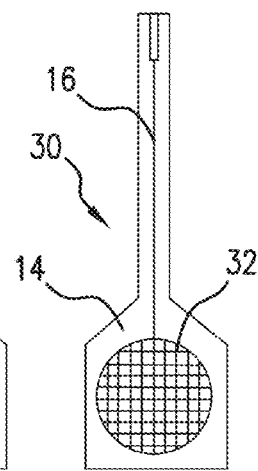

As examples of partial fill pattern capacitive touch sensors, FIG. 2 shows a 50% fill pattern capacitive touch sensor 20 and FIG. 3 shows a 35% fill pattern capacitive touch sensor 30. In FIG. 2, the 50% fill pattern capacitive touch sensor 20 has a 50% fill pattern capacitive element 22, meaning only 50% of a thin film substrate 14 under the 50% fill pattern capacitive element 22 is covered by conductive material. In FIG. 3, the 35% fill pattern capacitive touch sensor 30 has a 35% fill pattern capacitive element 32, meaning only 35% of a thin film substrate 14 under the 35% fill pattern capacitive element 32 is covered by conductive material. As the percentage of fill pattern decreases, the capacitance of the capacitive touch sensor is reduced, but the area covered by the capacitive touch sensor remains the same. For many applications that detect human finger touches, 35% and greater fill may decrease the cost of the capacitive touch sensor substantially without suffering significant performance loss. Thus a capacitive element can remain a large target for a user to touch, but with reduced conductive material.

In the embodiments shown in FIGS. 1-3, the partial fill pattern shown is a rectilinear grid of crisscrossed horizontal and vertical lines intersecting at right angles. However, other partial fill patterns may be used, such as a regular pattern of small circular pores. For convenience, herein "grid" shall mean any partial fill pattern.

Figure 4:
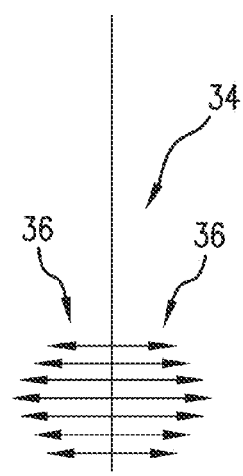

FIG. 4 shows a side view of a thin film capacitive touch sensor 34 like those discussed regarding FIGS. 1-3. When charged, a capacitive field 36 extends from the front and back of the thin film capacitive touch sensor 34. The capacitive field 36 is an electrical field that will interact with nearby conductive objects, such as a human finger, changing the effective capacitance of the thin film capacitive touch sensor 34. The thin film capacitive touch sensor 34 can be said to be "two-sided," since interaction with the capacitive field 36 on either the front side or back side can be detected via the change in effective capacitance.

Alternately, instead of screen printed conductive ink, one or more of the conductive pathways may be formed from thin copper or other metal layers. For example, one or more of the conductive pathways may be formed from a thin copper sheet that is photo-lithographically patterned and etched to form one or more of the conductive pathways, i.e. the capacitive element and/or related interconnects. Capacitive elements with partial fill patterns may be etched from thin metal as well. The copper conductive pathways may be laminated to a flexible substrate layer. Accordingly, both the copper and conductive ink conductive pathway embodiments, or a combination thereof, may form at least part of a flexible circuit (e.g., a "flex" circuit).

In some embodiments, any additional electronics that couple to the one or more capacitive elements and related interconnects may be at least in part be included on the same flexible substrate as the one or more thin film capacitive touch sensors. Alternately, at least some of the additional electronics may be included on a separate substrate. For example, at least some of the electronics may be included on a separate printed circuit board. Multiple circuits on multiple substrates may be electrically coupled together with any electrical coupling devices and/or methods known in the art.

Figure 5:
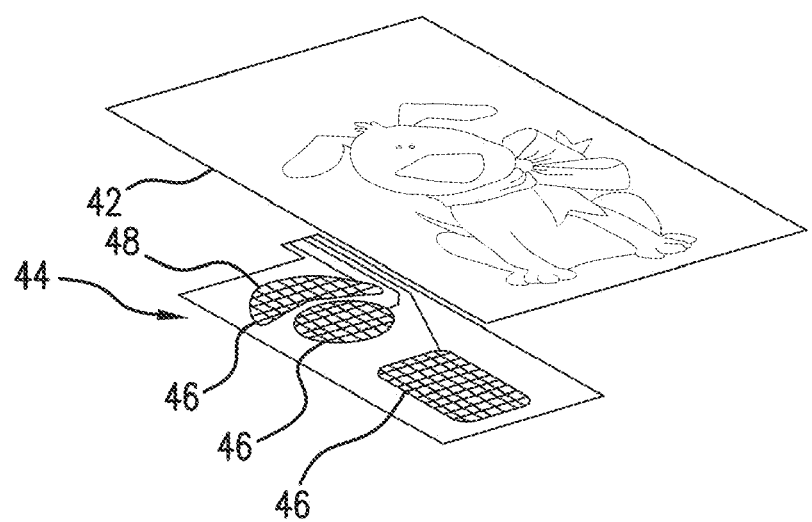
FIGS. 5 and 6 illustrate methods of combining thin film capacitive touch sensors with printed art.
Figure 6:
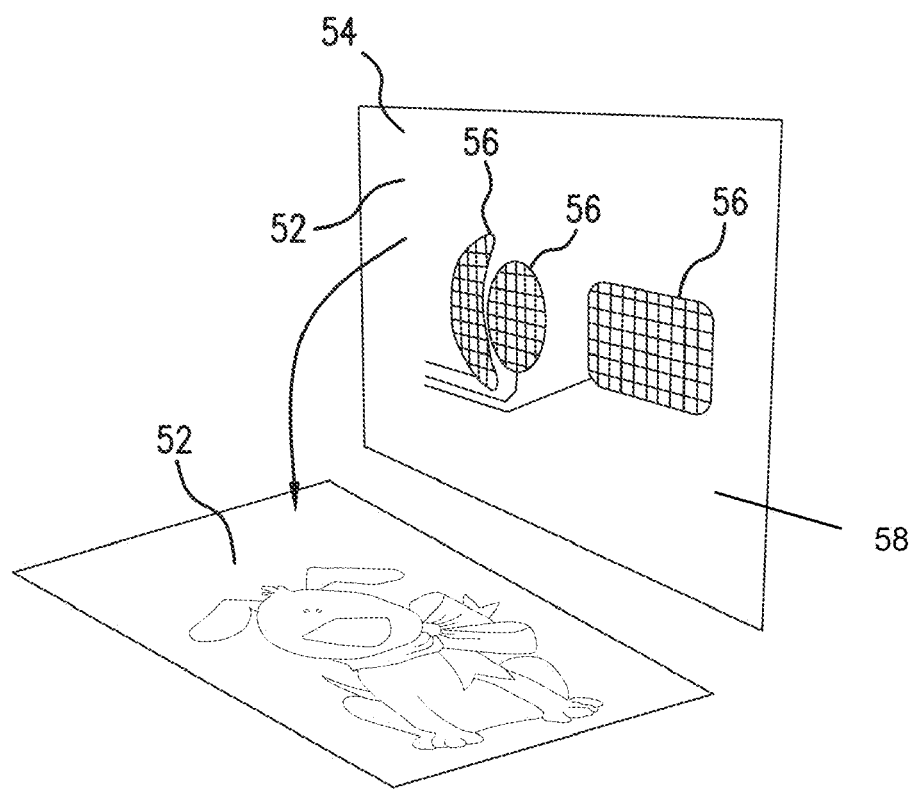

FIGS. 5 and 6 illustrate methods of combining thin film capacitive touch sensors with printed art. FIG. 5 illustrates a first method of combining thin film capacitive touch sensors with printed art. A capacitive touch sensor layer 44 is coupled to a printed art layer 42 by lamination, gluing or other process. This capacitive touch sensor layer 44 comprises one or more (three in the embodiment shown) capacitive elements 46 deposed on a thin film substrate 48 (e.g. paper or plastic), forming one or more thin film capacitive touch sensors, similar in construction to those described in the discussion regarding FIGS. 1-4. In this embodiment, the capacitive elements 46 are conductive ink deposed on the thin film substrate 48 using a screen printing process. In other embodiments, the capacitive elements 46 may be made with lithography out of metal foil, or some other method.

FIG. 6 illustrates a second method of combining thin film capacitive touch sensors with printed art. Here, a printed art layer 52 comprises art printed directly onto a thin film substrate 58. One or more capacitive elements 56 are deposed onto the same thin film substrate 58 as well, forming a capacitive touch sensor layer 54. In some embodiments, an opaque layer of non-conductive ink may be printed on the printed art layer 52 over the art and the capacitive elements 56 printed over the opaque layer. This opaque layer substantially prevents the conductive pathways and/or product supporting structure from showing through the thin film substrate 58. In other embodiments, the capacitive elements 56 are printed directly over the printed art layer 52 without an opaque layer.

FIGS. 7-18B illustrate embodiments of one-sided thin film capacitive touch sensors with conductive ground plane layers to substantially mitigate the two-sided functionality of the thin film capacitive touch sensors described by the discussion regarding FIGS. 1-6. In particular for games, toys, books, and greeting cards that may be handheld, one-sided thin film capacitive touch sensors may improve the ability with which a user may properly interact with the games, toys, books, and greeting cards.

Figure 7:
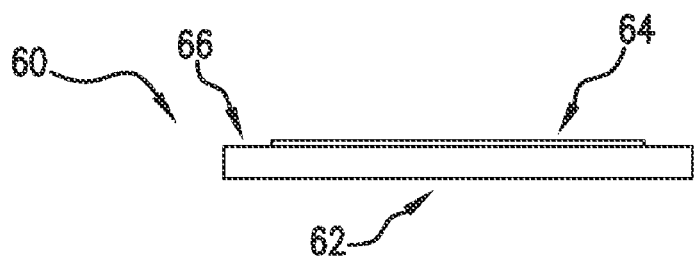
FIG. 7 illustrates a one-sided thin film capacitive touch sensor with a conductive ground plane layer.

FIG. 7 illustrates a one-sided thin film capacitive touch sensor 60 with a conductive ground plane layer 62. The one-sided thin film capacitive touch sensor 60 comprises a capacitive touch sensor layer 64 separated from the conductive ground plane layer 62 with a separation layer 66. The capacitive touch sensor layer 64 is a two-sided thin film capacitive touch sensor as described in the discussion regarding FIGS. 1-4. In this embodiment, the separation layer 66 is a thin sheet of dielectric material like paper or plastic. In one embodiment, the conductive ground plane layer 62 is constructed by mounting a very thin sheet of conductive material such as aluminum foil or screen printed conductive ink on the backside of the separation layer 66. The separation between the capacitive touch sensor layer 64 and the conductive ground plane layer 62 is a minimum of 0.5 mm. Any separation less than 0.5 mm causes base capacitance of the capacitive touch sensor layer 64 to increase dramatically, so much so that any touch by a human finger will not change the effective capacitance of the capacitive touch sensor layer 64, rendering such touches undetectable. Any separation less than 0.5 mm may cause the one-sided thin film capacitive touch sensor 60 to experience large changes in base capacitance when the capacitive touch sensor layer 64 experiences mechanical bending. Simply flexing the one-sided thin film capacitive touch sensor 60 may lead to fluctuations in effective capacitance larger than those typically seen when one-sided thin film capacitive touch sensor 60 is touched by a human finger, degrading the touch sensitivity of the one-sided thin film capacitive touch sensor 60.

Figure 8:
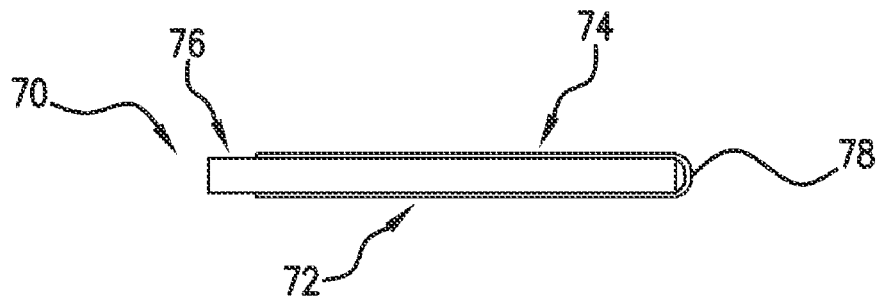
FIG. 8 illustrates a one-sided thin film capacitive touch sensor with an alternative ground plane configuration.

FIG. 8 illustrates a one-sided thin film capacitive touch sensor 70 with an alternative ground plane configuration. The one-sided thin film capacitive touch sensor 70 has one or more capacitive elements 71 (not visible this view, see FIG. 9) deposed on a thin film 78 to form a capacitive touch sensor layer 74 and a conductive ground plane layer 72 deposed on the same thin film 78, the thin film 78 wrapped around a separation layer 76. In this embodiment, the separation layer 76 is a thin sheet of dielectric material like paper or plastic.

Figure 9:
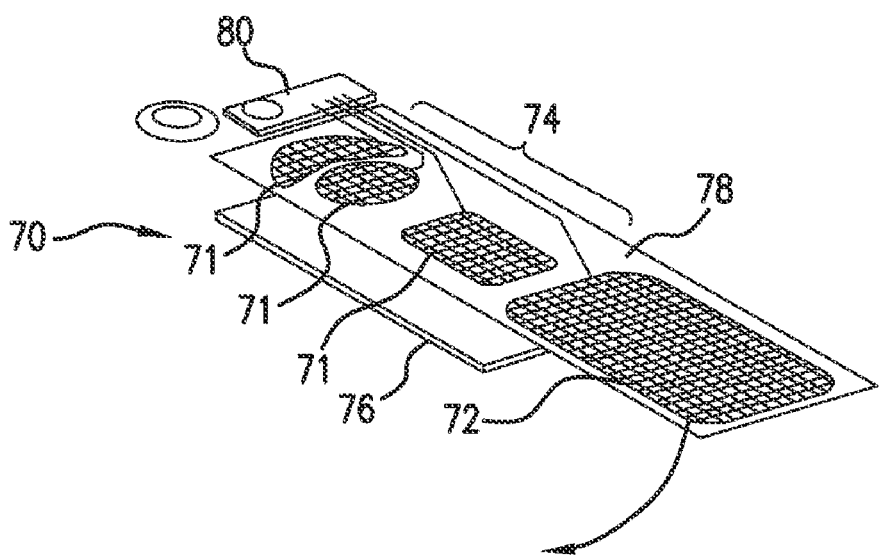
FIG. 9 shows another view of the one-sided thin film capacitive touch sensor of FIG. 8.

FIG. 9 shows another view of the one-sided thin film capacitive touch sensor 70 of FIG. 8, showing the capacitive elements 71 and conductive ground plane layer 72 deposed on the same thin film 78, the thin film 78 laid flat, but configured to be wrapped around separation layer 76 (see FIG. 9C with arrow showing wrapping action). The conductive ground plane layer 72 may be a grid or solid fill pattern, as described above regarding FIGS. 1-4. In some embodiments, capacitive elements 71 and the conductive ground plane layer 72 may be formed from the same conductive material (e.g., conductive ink) and substantially simultaneously (e.g., from the same patterned printing screen). Also shown are electronics 80 for measuring the effective capacitance of the one-sided thin film capacitive touch sensor 70.

Figure 10:
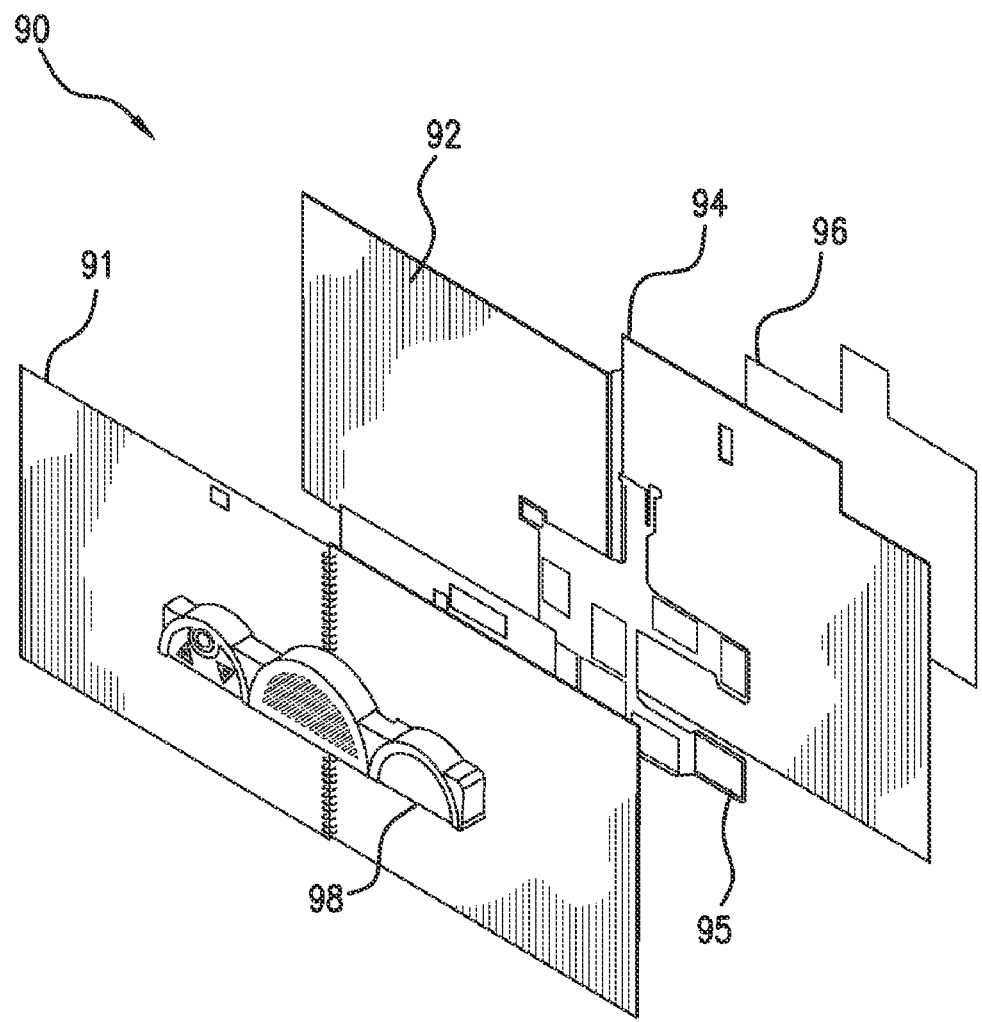
FIG. 10 is an exploded view of a book constructed with thin film capacitive touch sensors and a conductive ground plane layer.

FIG. 10 is an exploded view of a book 90 constructed with thin film capacitive touch sensors and a conductive ground plane layer. The book 90 has pages 91, a front cover 92 and a back cover 94, a capacitive touch sensor layer 95 with one or more thin film capacitive touch sensors, a conductive ground plane layer 96, and a lattice backing 98. The capacitive touch sensor layer 95 is deposed on a side of the back cover 94 facing the pages 91 and the conductive ground plane layer 96 is deposed on the other side of the back cover 94. An electronics package 99 is attached to the back cover 94. The conductive ground plane layer 96 in or adjacent the back cover 94 will lower the sensitivity of the thin film capacitive touch sensors to a user's hands and lower the likelihood of false and/or unintentional capacitive sensor triggering when, for example, the book is held.

Figure 11:
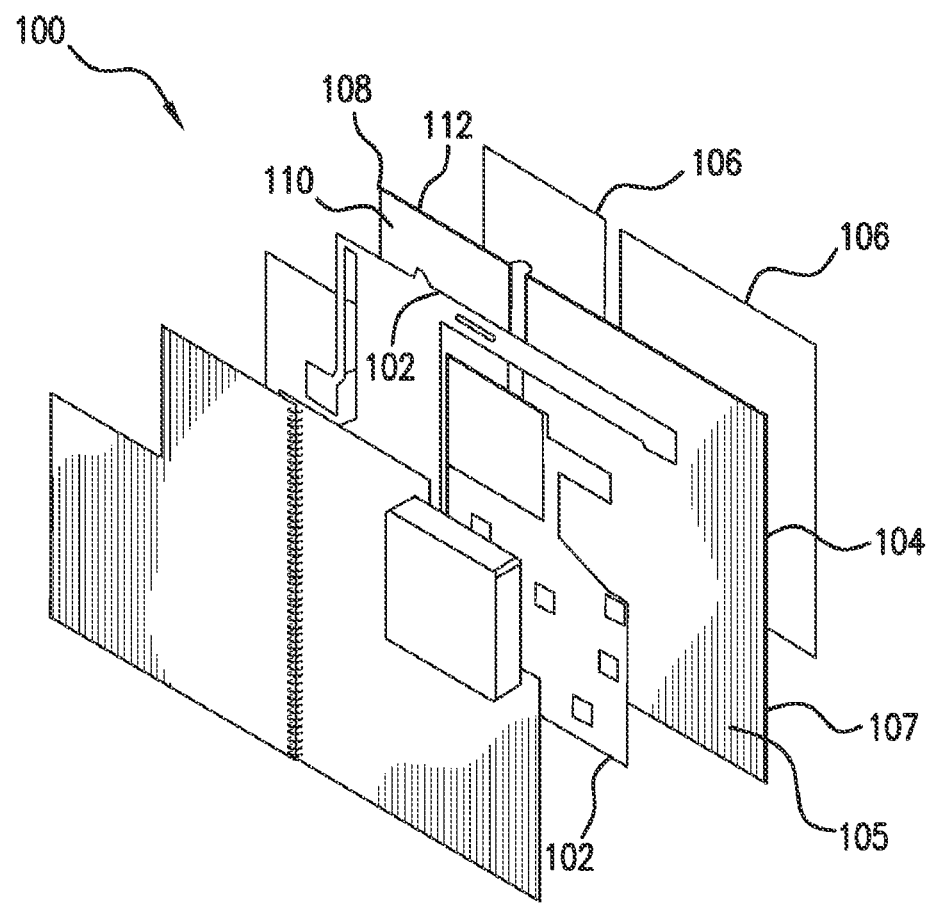
FIG. 11 illustrates book construction with thin film capacitive touch sensors of the front and back covers and one or more foil ground planes.

FIG. 11 is an exploded view of a book 100 constructed with thin film capacitive touch sensors 102. The book 100 has a back cover 104 with an outside surface 107 and an inside surface 105. The book 100 has a front cover 108 with an outside surface 112 and an inside surface 110. The thin film capacitive touch sensors 102 are deposed on inside surfaces 105 and 110. Conductive ground plane layers 106 are deposed on outside surfaces 107 and 112. An electronics package 114 is attached to the back cover 104 and electrically coupled to the thin film capacitive touch sensors 102 and the conductive ground plane layers 106. In some embodiments, the front and/or back covers 104 and 108 typically include a paper board that is approximately 2.0 mm thick. This separation exceeds the 0.5 mm separation between the capacitive touch sensor layer and the conductive ground plane layer required for good one-sided sensor characteristics. Since covers are a feature generally included with the book, there is no marginal expense of adding additional layers to achieve good one sided sensor operation.

Figure 12:
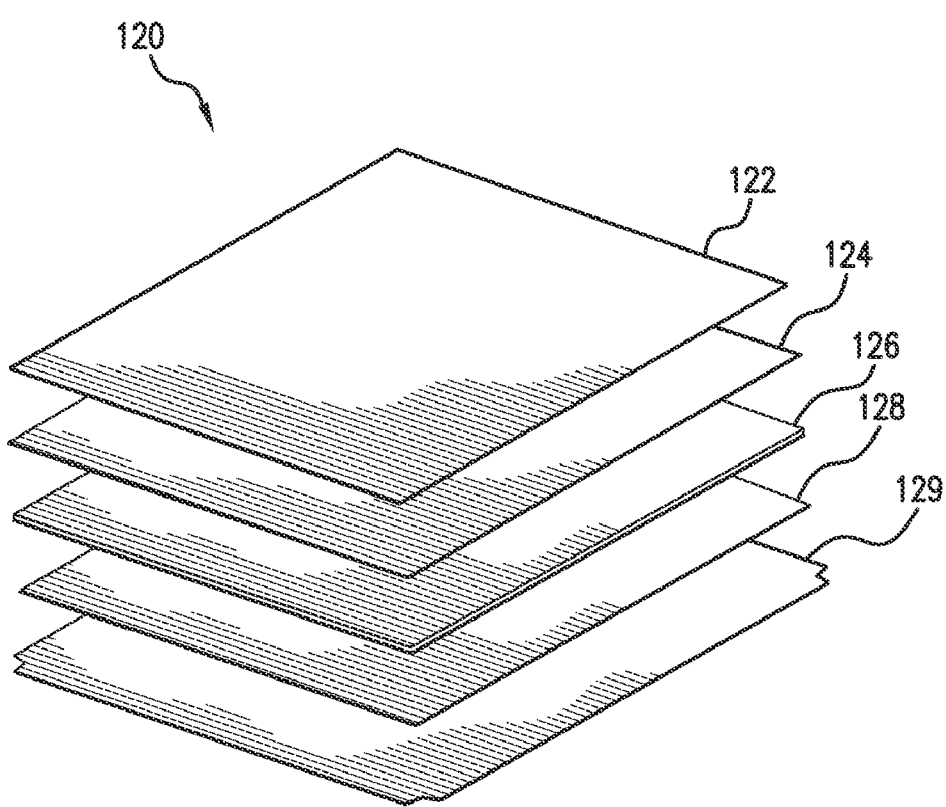
FIG. 12 illustrates board game construction with thin film capacitive touch sensors and a conductive ground plane layer.

FIG. 12 illustrates a interactive board game 120 embodiment. The interactive board game 120 includes a printed art layer 122, a capacitive touch sensor layer 124, a separation layer 126 (e.g. chip board), a conductive ground plane layer 128 (e.g., a metal foil and/or metal foil paper), and a game board back wrap 129. The capacitive touch sensor layer 124 is separated from the conductive ground plane layer 128 by the separation layer's 126 approximately 2.0 mm thickness. This provides more than the 0.5 mm separation between the capacitive touch sensor layer 124 and the conductive ground plane layer 128 required for good one-sided sensor characteristics.

Figure 13:
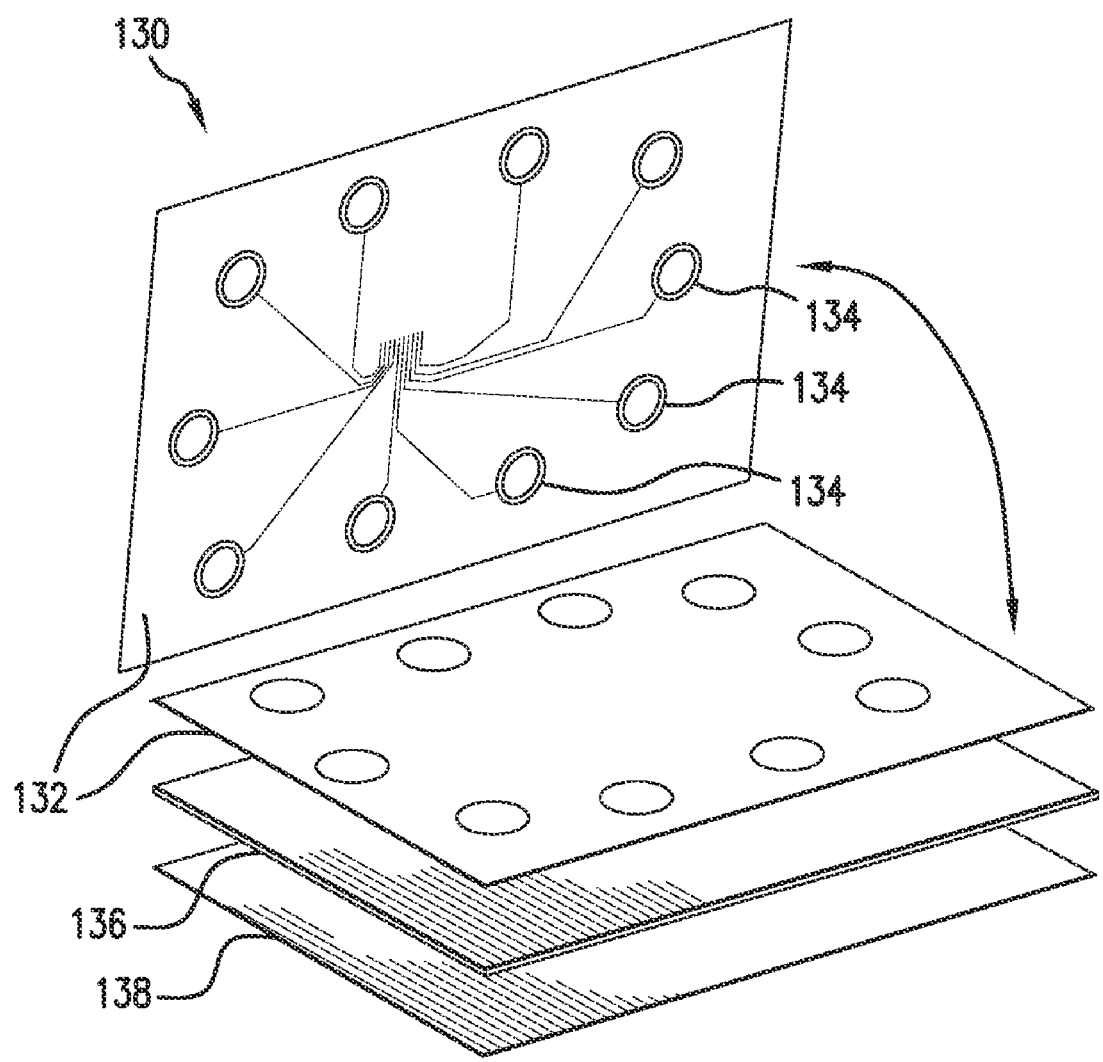
FIG. 13 illustrates board game construction of an alternate embodiment.

FIG. 13 illustrates a board game 130 embodiment constructed with a thin film capacitive touch sensors 134 printed on the backside (underside) of a printed art layer 132. Similar to the configuration of layers illustrated by FIG. 12, the thin film capacitive touch sensors 134 may be separated from a conductive ground plane layer 138 by a separation layer 136 (such as a chip board) that is approximately 2.0 mm thick. This provides more than the 0.5 mm separation required for good one-sided sensor characteristics.

Figure 14:
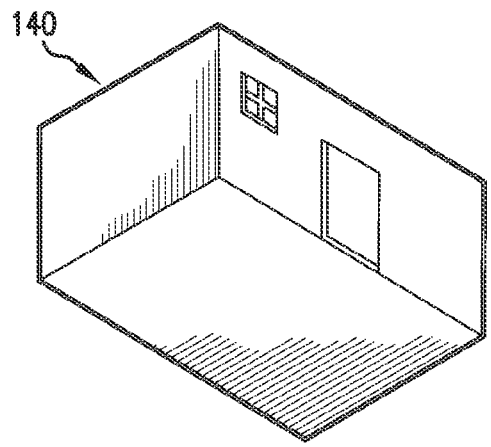
FIG. 14 illustrates an example of a one room doll house.
Figure 15:
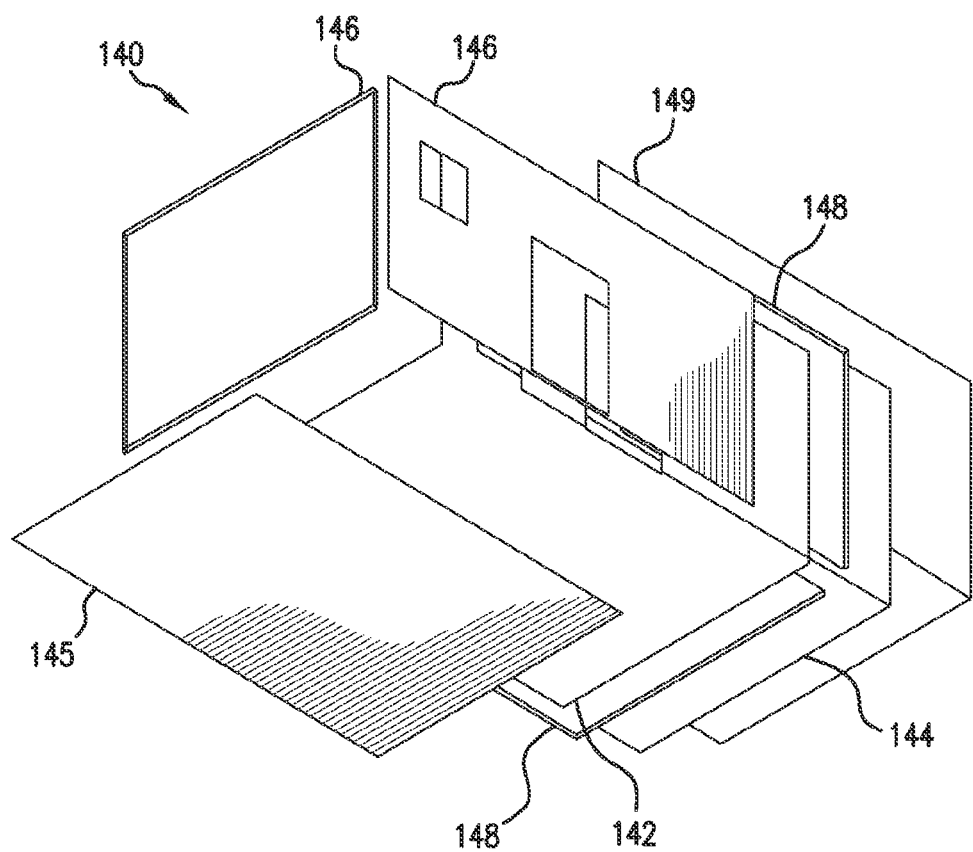
FIG. 15 illustrates doll house construction with thin film capacitive touch sensors and a conductive ground plane layer.

FIG. 14 illustrates a one room doll house 140 embodiment. FIG. 15 shows an exploded view of the details of the doll house 140 construction including a capacitive touch sensor layer 142 and a conductive ground plane layer 144. The capacitive touch sensor layer 142 may be laminated into floor 145 and walls 146 of the doll house 140. The capacitive touch sensor layer 142 may alternately be glued to the floor 145 and walls 146 of the doll house. The conductive ground plane layer 144 may be laminated to the outside of the doll house 140 to block unwanted capacitive sensitivity. In this embodiment, the capacitive touch sensor layer 142 are separated from the conductive ground plane layer 144 with a separation layer 148 (e.g., chip board and/or plastic) that is approximately 1.0 mm to 2.0 mm thick. This provides more than the 0.5 mm separation required for good one-sided sensor characteristics. A printed outside wall decorative layer 149 covers and protects the conductive ground plane layer 144.

Figure 16A:
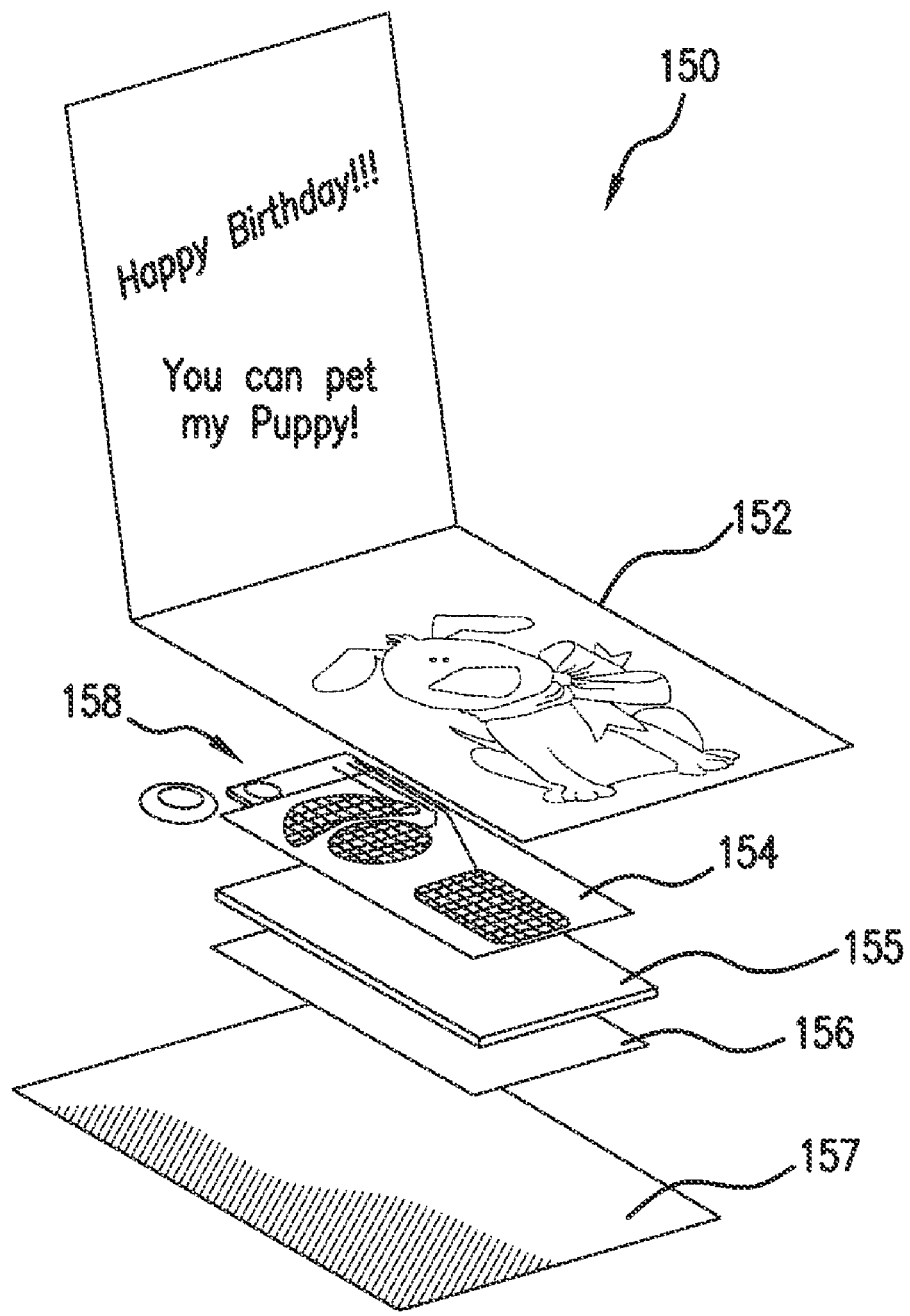
FIG. 16A illustrates greeting card construction with thin film capacitive touch sensors and a conductive ground plane layer.

FIG. 16A illustrates a greeting card 150. The greeting card 150 includes a printed art layer 152, a capacitive touch sensor layer 154, a separation layer 155, a conductive ground plane layer 156, a card backing layer 157, and an electronics package 158. The separation layer 155 may be an approximately 2.0 mm thick chip board and the conductive ground plane layer 156 may be a metal foil and/or metal foil paper. The shielding of the capacitive touch sensor layer 154 is an important feature for the greeting card to function properly as a greeting card is hand held when it is operated. The inclusion of the conductive ground plane layer 156 will mitigate false and/or unintentional triggering of thin film capacitive touch sensors in the capacitive touch sensor layer 154 from the back side of the greeting card 150 when the greeting card 150 is being held.

Figure 16B:
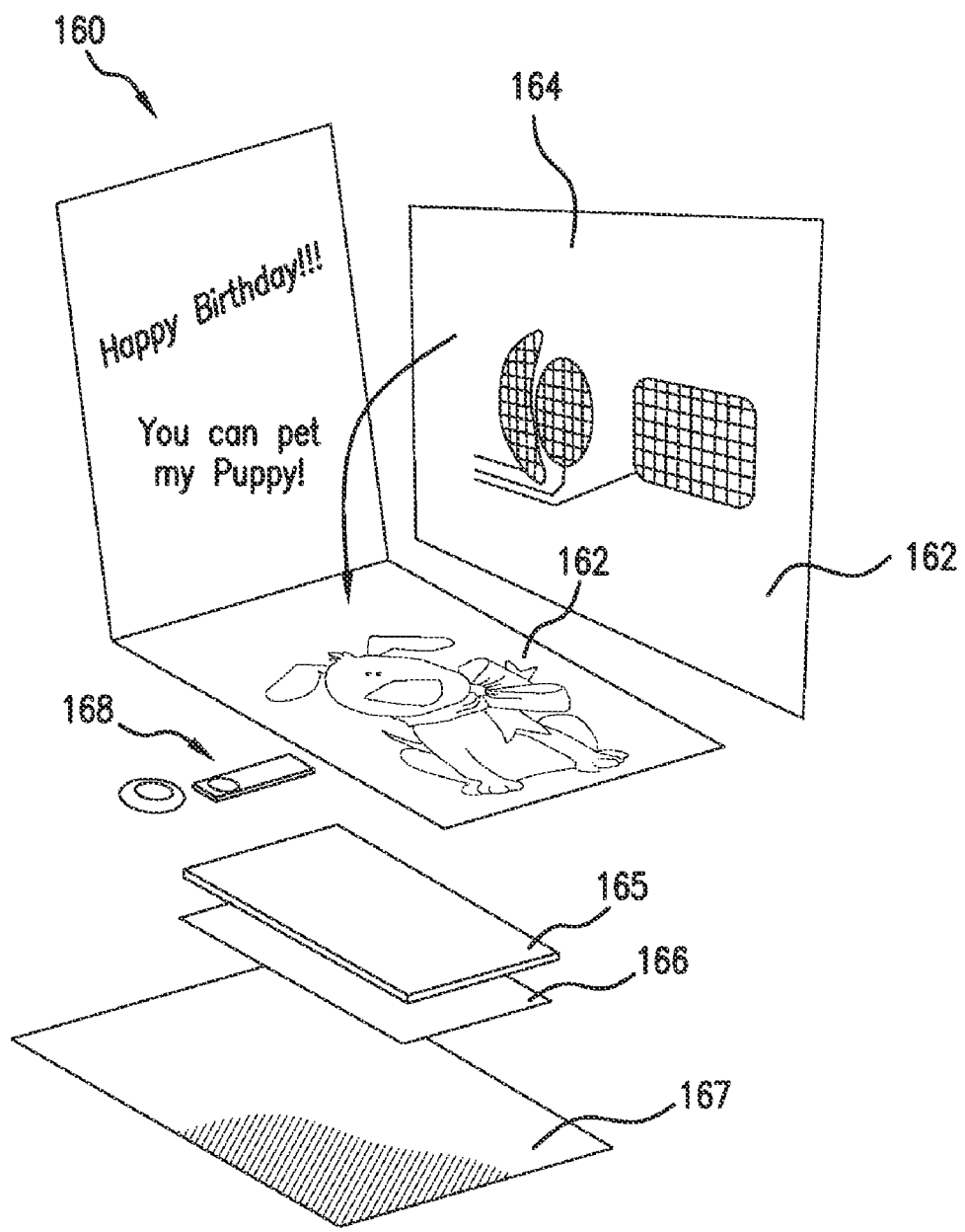
FIG. 16B illustrates greeting card construction of an alternate embodiment.

FIG. 16B illustrates a greeting card 160 alternate embodiment. The greeting card 160 includes a printed art layer 162, a capacitive touch sensor layer 164, a separation layer 165, a conductive ground plane layer 166, a card backing layer 167, and an electronics package 168. In this embodiment, the capacitive touch sensor layer 164 is integrally formed with the printed art layer 162. The separation layer 165 may be an approximately 2.0 mm thick chip board and the conductive ground plane layer 166 may be a metal foil and/or metal foil paper. The shielding of the capacitive touch sensor layer 164 is an important feature for the greeting card to function properly as a greeting card is hand held when it is operated. The inclusion of the conductive ground plane layer 166 will mitigate false and/or unintentional triggering of thin film capacitive touch sensors in the capacitive touch sensor layer 164 from the back side of the greeting card 160 when the greeting card 160 is being held.

Figure 17A:
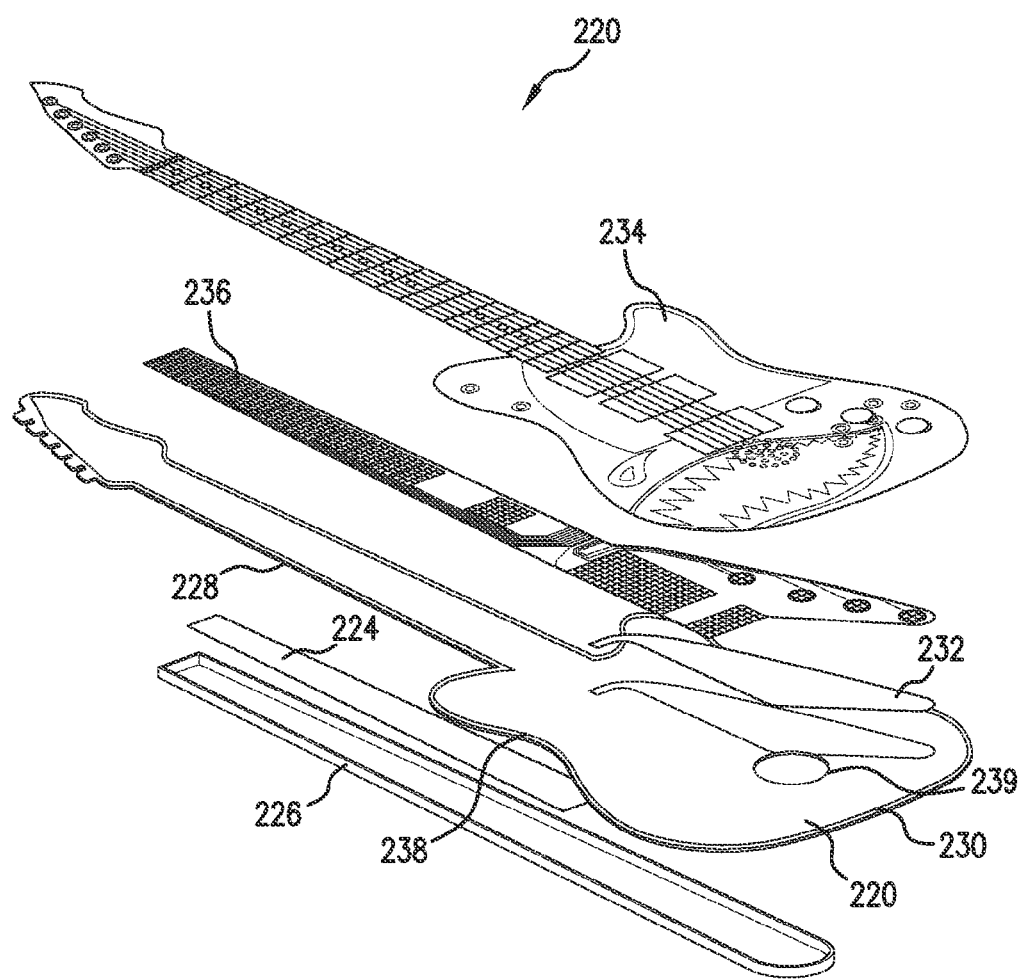
FIG. 17A illustrates guitar construction with thin film capacitive touch sensors and one or more conductive ground plane layers.

FIG. 17A illustrates a capacitive guitar 220 embodiment construction using a separate printed sensor layer beneath the printed art layer. The capacitive guitar 220 comprises a guitar body 222, a guitar neck 228, a neck housing 226, a neck conductive ground plane layer 224, a body conductive ground plane layer 230, a body separation layer 232, a printed art layer 234, capacitive touch sensor layer 236, an electronics package 238 and a speaker 239. In this embodiment, two separate conductive ground plane layers are used because of the product's physical design. The guitar body 222 provides a separation layer for a neck conductive ground plane layer 224. This is possible because of the neck housing 226 covering the back of the guitar neck 228. The body conductive ground plane layer 230 doesn't have a separate housing covering the back of the entire guitar body 222, so it is mounted on the top of the guitar body 222 with body separation layer 232 between it and the capacitive touch sensor layer 236. In general, the guitar is constructed substantially the same as the book, game board, and greeting card embodiments described above.

Figure 17B:
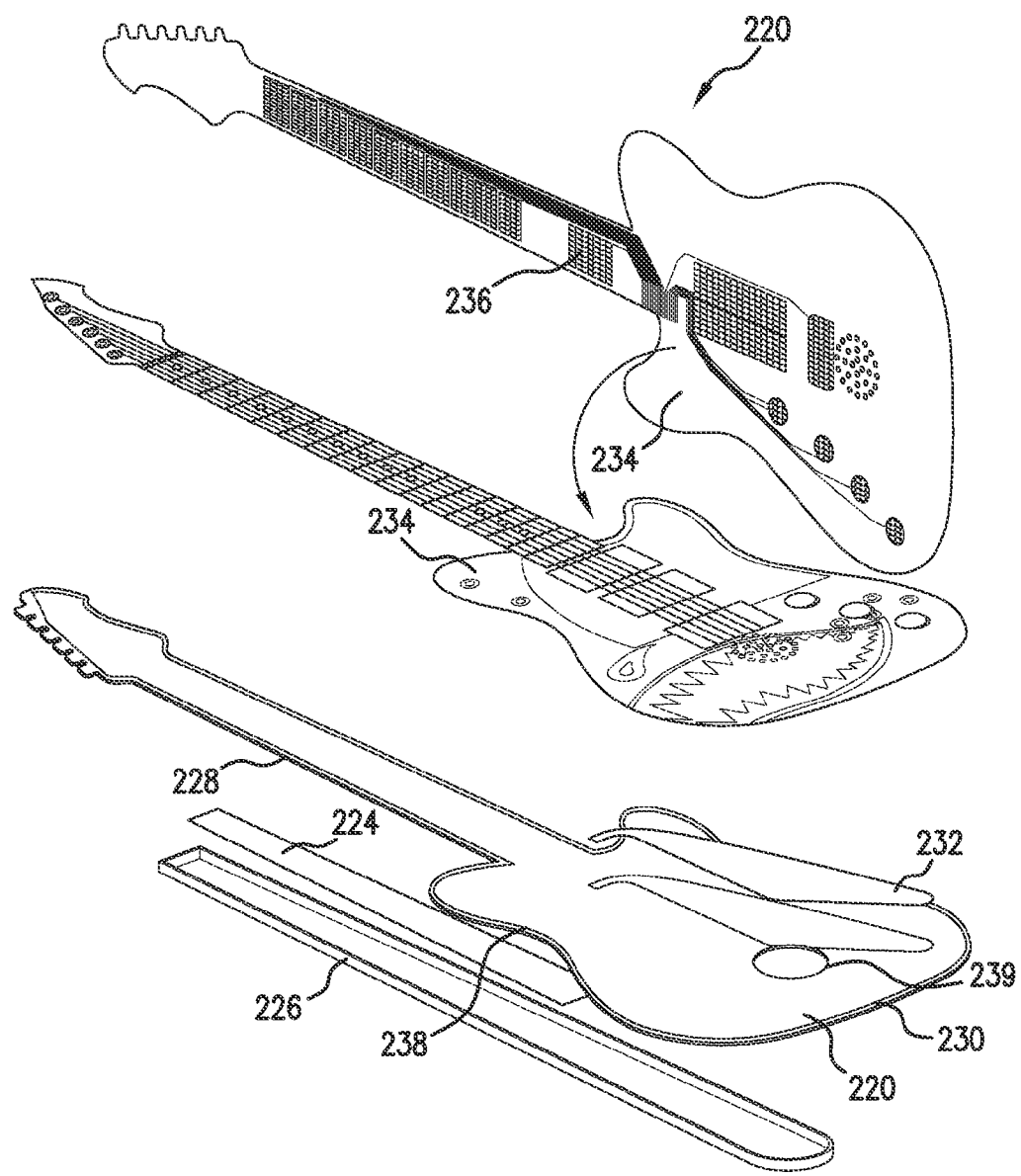
FIG. 17B illustrates guitar construction of an alternate embodiment.

Alternately, as illustrated by FIG. 17B, the capacitive touch sensor layer 236 combined into the printed art layer 234, the combined layer with both full color printing on the front side and screen printed capacitive elements on the backside or underside.

Figure 18A:
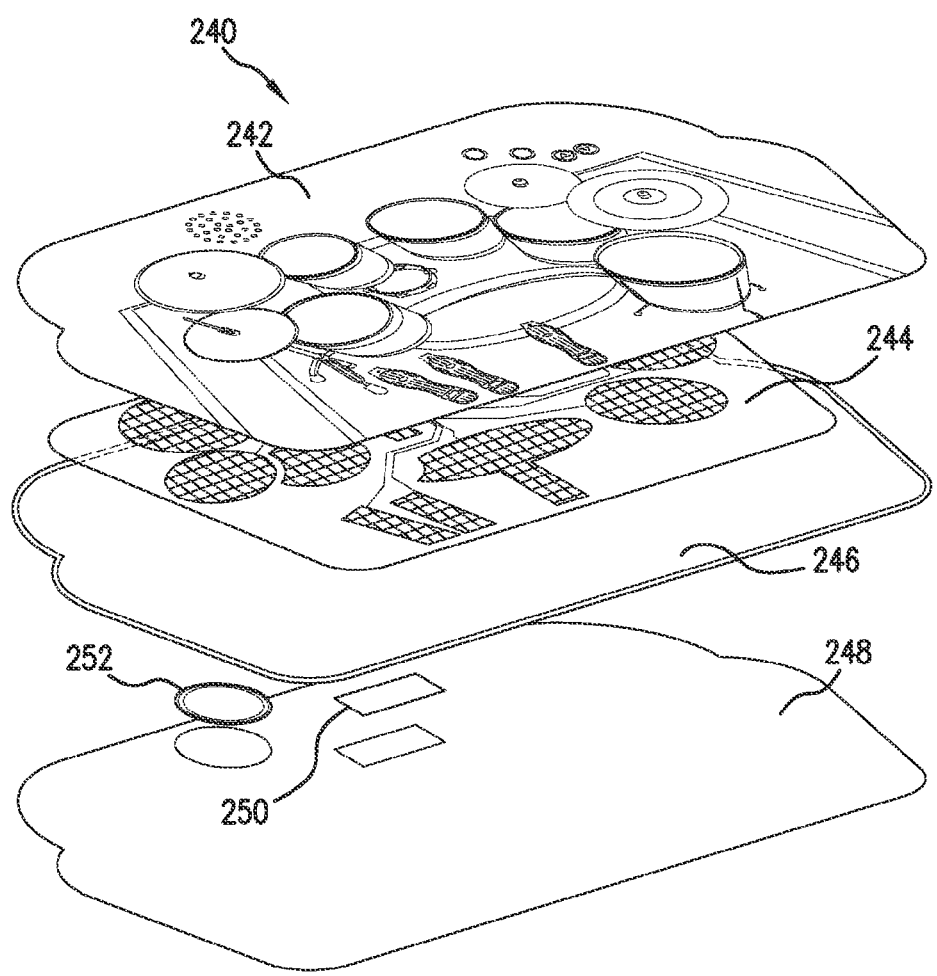
FIG. 18A illustrates drum set construction with thin film capacitive touch sensors and a conductive ground plane layer.
Figure 18B:
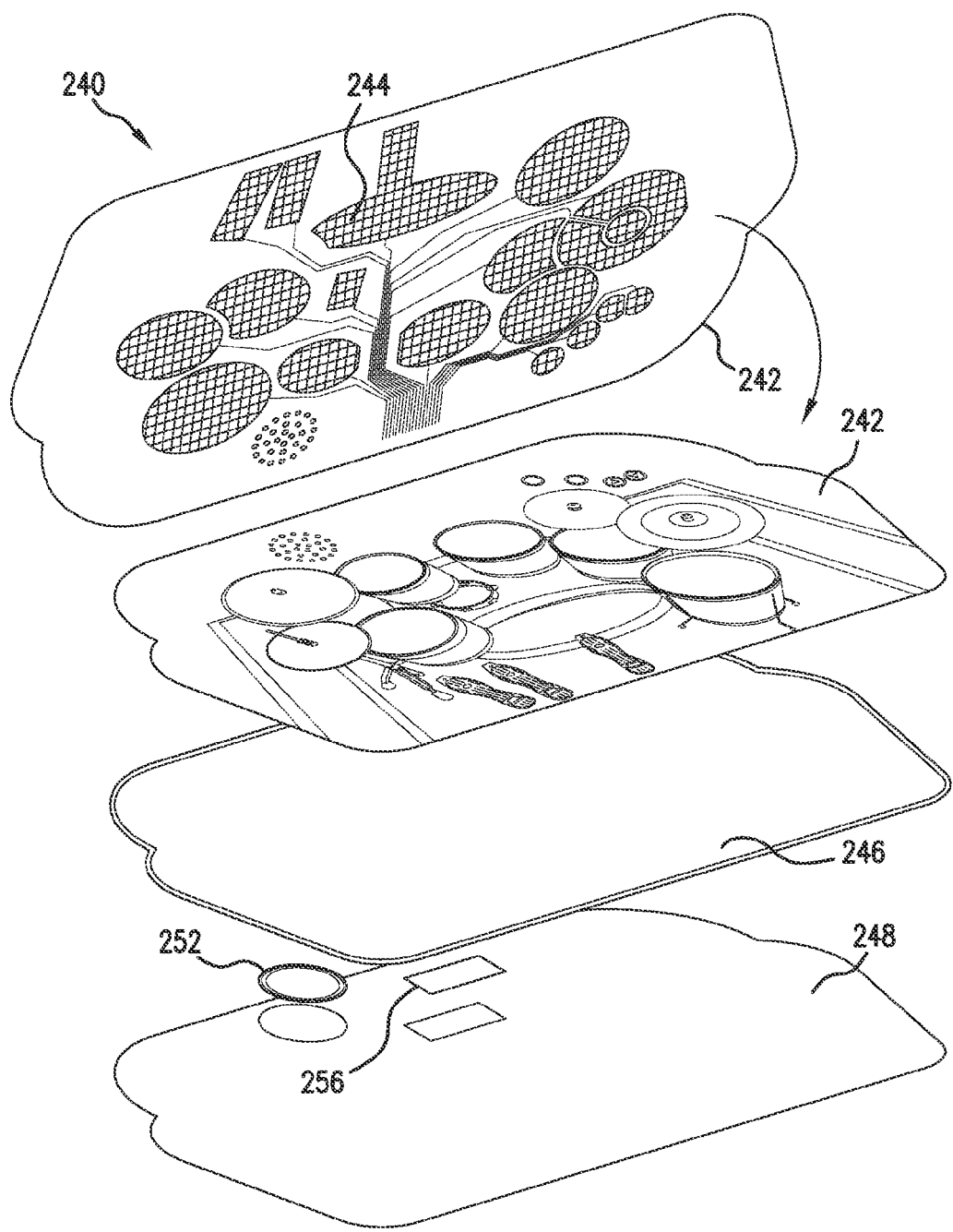
FIG. 18B illustrates drum set construction of an alternate embodiment.

FIGS. 18A and 18B illustrate a capacitive drum set 240. The capacitive drum set 240 has a printed art layer 242, a capacitive touch sensor layer 244, a plastic drum platform 246, a conductive ground plane layer 248, an electronics package 250, and a speaker 252. In general, the drum set is constructed substantially the same as the book, game board, greeting card, and guitar embodiments described above. Alternately, as illustrated by FIG. 18B, the capacitive touch sensor layer 244 is combined in the printed art layer 242 with both full color printing on the front side and the screen printed capacitive elements on the backside or underside. For both embodiments, the plastic drum platform may serve as the separation layer between the capacitive touch sensor layer 244 and the conductive ground plane layer 248.

FIGS. 19A-26B illustrate embodiments including an air gap layer to substantially mitigate the two-sided functionality of the thin film capacitive touch sensors described by FIGS. 1-8 while maintaining the substantially low cost and simple construction. In particular for games, toys, books, and greeting cards that may be handheld, the one-sided functionality of the thin film capacitive touch sensors may improve the ability with which a user may properly interact with the games, toys, books, and greeting cards.

As an alternate approach to including a conductive ground plane layer shield to form a substantially one-sided capacitive sensor, other embodiments use materials with very low dielectric constants as a shield for one side of the capacitive sensor. More specifically, one very inexpensive material with a very low dielectric constant is air. The inclusion of an air gap layer will lower the capacitive sensitivity on the air gap layer side of the capacitive sensor. Nevertheless, a capacitive field may still be triggered by proximity though the air depending on the configuration of the capacitive sensor. Accordingly, one-sided thin film capacitive touch sensors with an air gap layer should be tested for any potential application to determine their suitability. For example, there is a relationship between the size/area of a touch capacitive sensor and its proximity sensitivity through air. Generally, larger capacitive touch sensors are more sensitive and may require a thicker air-gap for proper shielding. As a guideline, the air gap layer should be at least the thickness of any overlay material on top of the capacitive elements. For example, a configuration that includes a thin film capacitive touch sensor 2 mil thick (capacitive elements printed in conductive ink on bottom), an printed art layer 10 mil thick and a 5 mil layer of glue totals an overlay of 17 mil over the capacitive elements. This would suggest an air gap layer of at least a 17 mil (~0.5 mm). For capacitive elements less than 2 square inches in area, an air gap layer of five times the overlay thickness have proven to be sufficient.

Figure 19A:
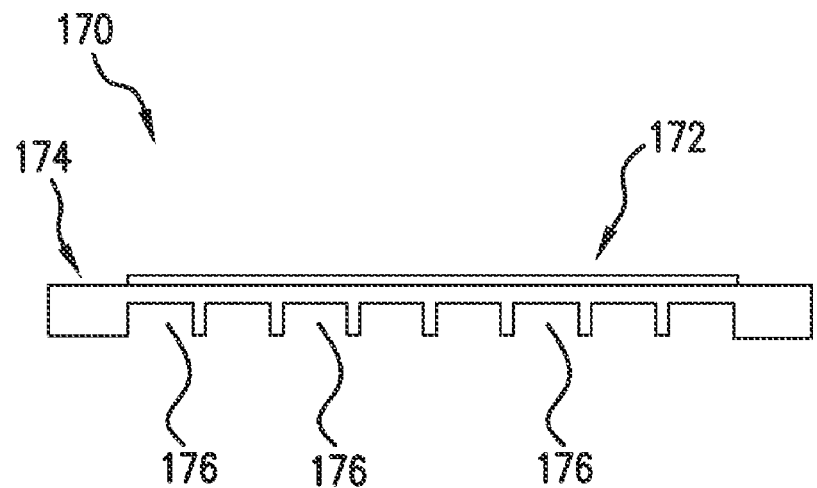
FIG. 19A illustrates a side view of a capacitive sensor with air gap layers for shielding.

FIG. 19A shows a side view of one-sided thin film capacitive touch sensor 170 including an air gap layer 176 for shielding. The one-sided thin film capacitive touch sensor 170 includes a capacitive touch sensor layer 172 mounted to a separating base 174. The separating base 174 has a molded or cut pattern to create the air gap layer 176 on a side of the separating base 174 opposite the capacitive touch sensor layer 172. The separating base 174 prevents foreign objects, such as a human finger, from entering the air gap layer 176 and changing the effective capacitance of a sensor in the capacitive touch sensor layer 172. The air gap layer 176 mitigates sensitivity to touch from the bottom, as explained above. In this embodiment the separating base 174 has a lattice structure, but in other embodiments, structures with other geometries, such as a corrugation structure, may be used to create the air gap layer 176.

Figure 19B:
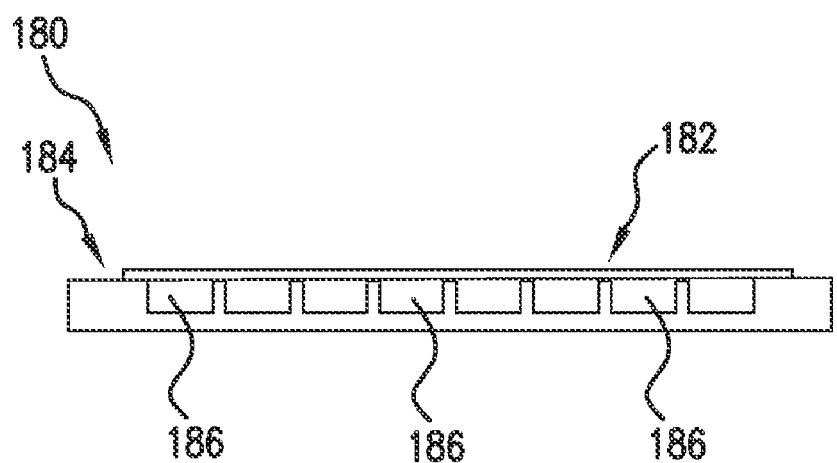
FIG. 19B illustrates a side view of a capacitive sensor of an alternate embodiment with air gap layers for shielding.

FIG. 19B shows a side view of one-sided thin film capacitive touch sensor 180 including an air gap layer 186 for shielding. The one-sided thin film capacitive touch sensor 180 includes a capacitive touch sensor layer 182 mounted to a separating base 184. The separating base 184 has a molded or cut pattern to create the air gap layer 186 on a side of the separating base 184 closest to the capacitive touch sensor layer 182. The separating base 184 prevents foreign objects, such as a human finger, from entering the air gap layer 186 and changing the effective capacitance of a sensor in the capacitive touch sensor layer 182. The air gap layer 186 mitigates sensitivity to touch from the bottom. In this embodiment the separating base 184 has a lattice structure, but in other embodiments, structures with other geometries, such as a corrugation structure, may be used to create the air gap layer 186.

Figure 19C:
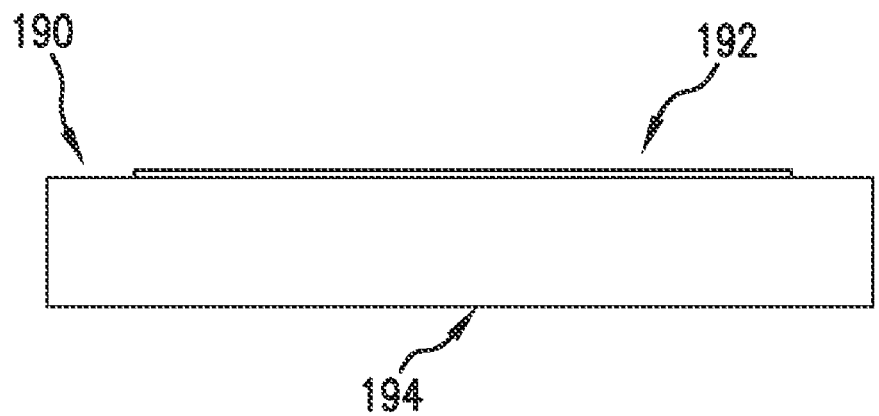
FIG. 19C illustrates a side view of a capacitive sensor of an alternate embodiment with separating material for shielding.

FIG. 19C shows a side view of a one-sided thin film capacitive touch sensor 190 including a thick separating material 194. The one-sided thin film capacitive touch sensor 190 includes a capacitive touch sensor layer 192 mounted to the thick separating material 194. The thick separating material 194 is a non-conducting material such as plastic or cardboard. The one-sided thin film capacitive touch sensor 190 reduces or eliminates sensitivity to touches on the back side of the capacitive touch sensor layer 192 with thick separating material 194. The thick separating material 194 forces such touches further from the back side of the capacitive touch sensor layer 192 and accordingly reduces change to effective capacitance of the capacitive touch sensor layer 192 during such touches.

Figure 20:
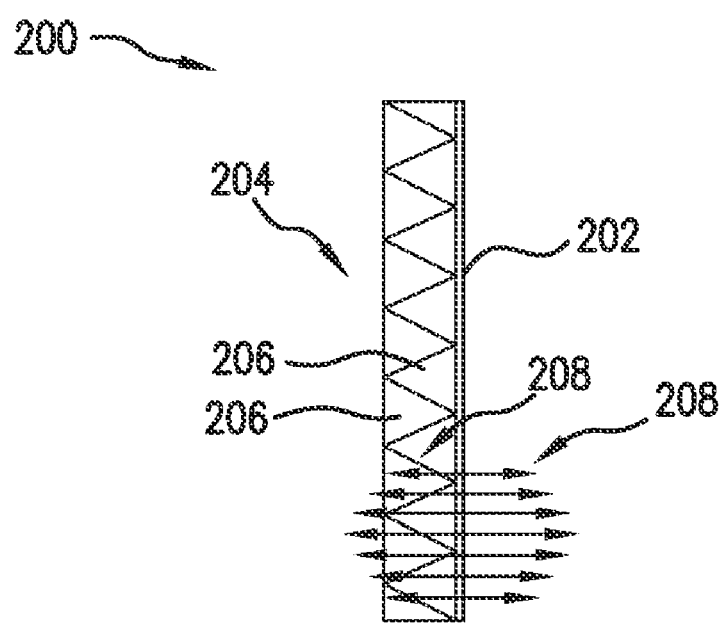
FIG. 20 illustrates a side view of a capacitive sensor mounted on corrugated cardboard for shielding.

FIG. 20 shows a one-sided thin film capacitive touch sensor 200 with air gap layer 206 provided by a corrugated structure 204, such as corrugated cardboard or similar materials. The thin film capacitive touch sensor 200 has a capacitive touch sensor layer 202 mounted on the corrugated structure 204, which mitigates sensitivity to touches on a side of the capacitive touch sensor layer 202 nearest the corrugated structure 204 (i.e. the back side) due to diminished strength of a capacitive field 208 generated by the capacitive touch sensor layer 202 after passing through the corrugated structure 204. Such corrugated structures, in particular with corrugated cardboard and the like, are inexpensive construction materials common to games and toys.

Accordingly, these air gap layer embodiments of one-sided thin film capacitive touch sensors may be easily and inexpensively integrated into games, toys, and the like to add interactive and other computer-based features. For example, as will be explained in more detail below, a conductive ground plane layer may be replaced by a lattice structure or the like to provide substantially one-sided functionality for capacitive touch sensors.

Figure 21:
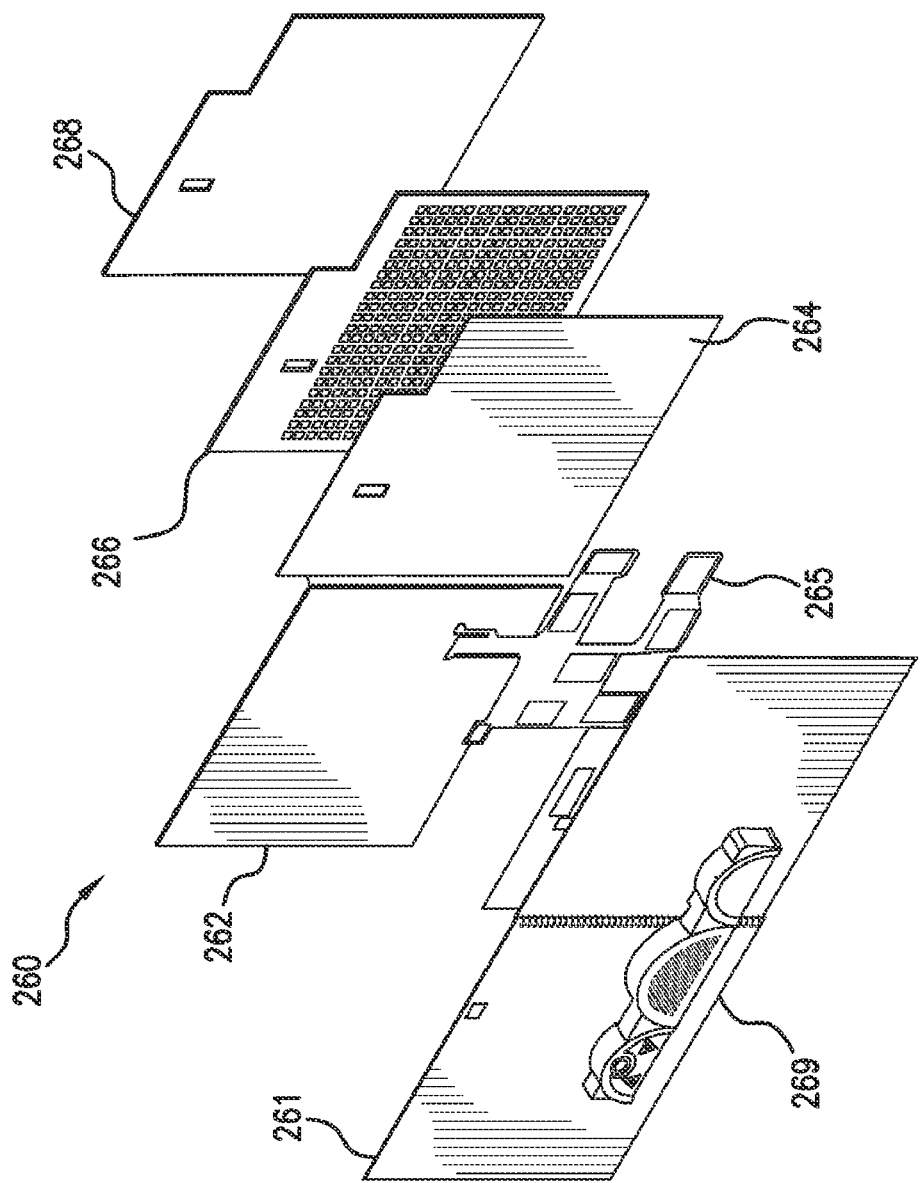
FIG. 21 illustrates book construction with thin film capacitive touch sensors and an air gap layer.

FIG. 21 is an exploded view of a book 260 constructed with thin film capacitive touch sensors and a lattice structure to provide an air gap layer. The book 260 has pages 261, front cover 262 and a back cover 264, a capacitive touch sensor layer 265 with one or more thin film capacitive touch sensors, a lattice structure 266, and a lattice backing 268. The capacitive touch sensor layer 265 is deposed on a side of the back cover 264 facing the pages 261 and the lattice structure 266 is deposed on the other side of the back cover 264. An electronics package 269 is attached to the front cover 262. As illustrated, the lattice structure 266 is provided between the capacitive touch sensor layer 265 and the lattice backing 268 to form an air gap layer while providing mechanical support to the lattice backing 268. The air gap layer in or adjacent the back cover 264 will lower the sensitivity of the thin film capacitive touch sensors to a user's hands and lower the likelihood of false and/or unintentional capacitive sensor triggering when, for example, the book is held. Said differently, the air gap layer increases the one-sided functionality of the thin film capacitive touch sensors.

Figure 22:
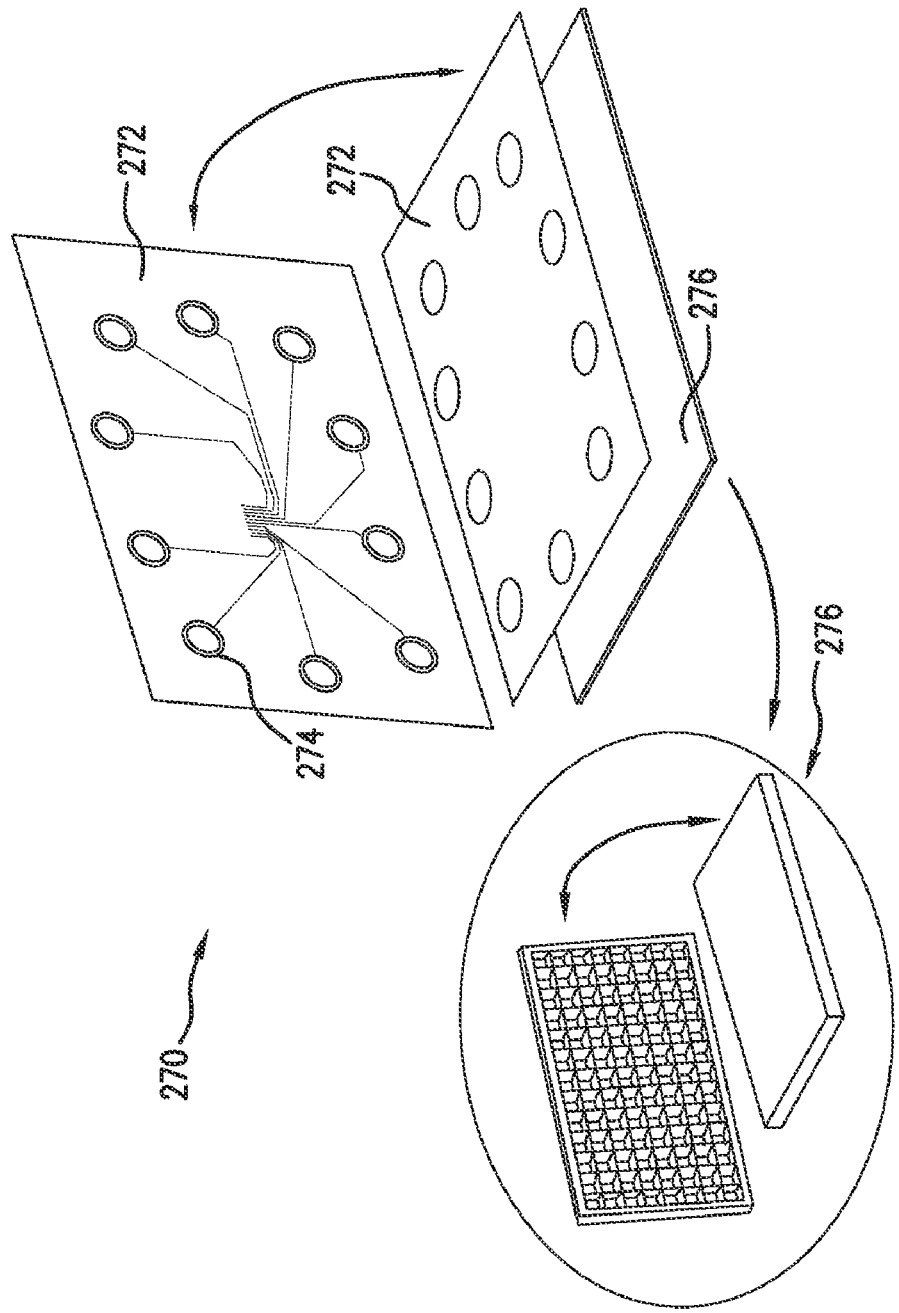
FIG. 22 Illustrates board game construction with thin film capacitive touch sensors and an air gap layer.
Figure 23:
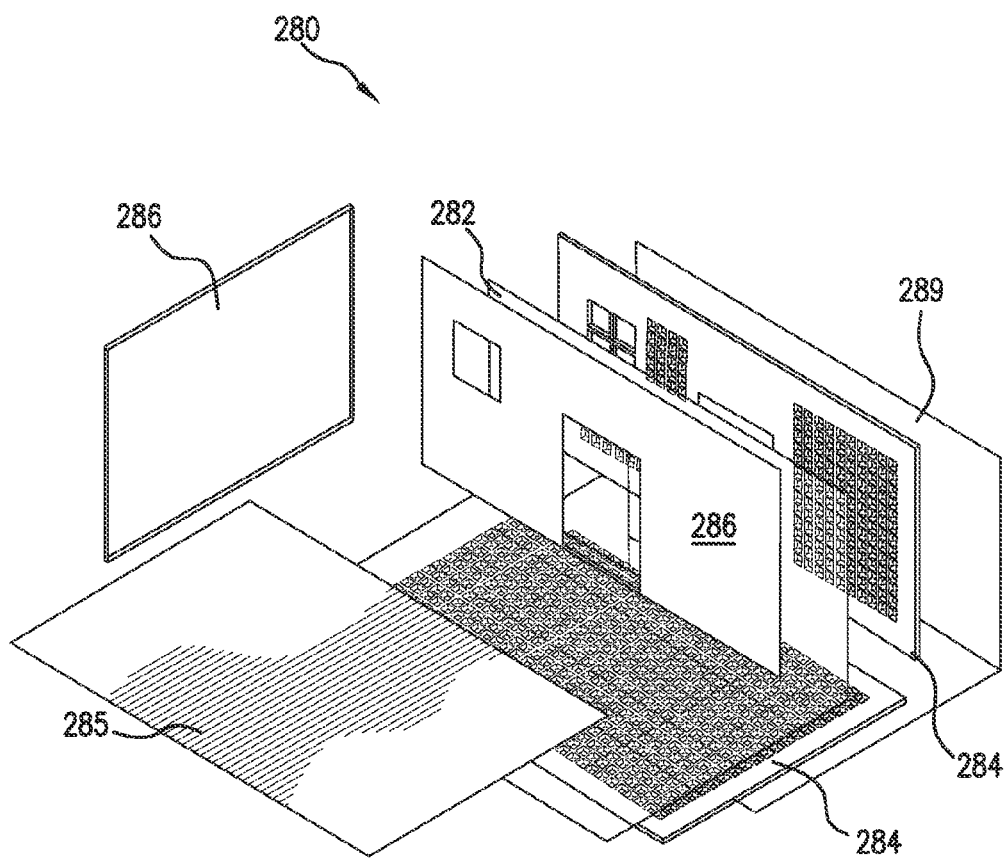
FIG. 23 illustrates doll house construction with thin film capacitive touch sensors and an air gap layer.

FIG. 22 illustrates a interactive board game 270 embodiment with a lattice structure to provide an air gap layer. The interactive board game 270 includes a printed art layer 272, a capacitive touch sensor layer 274, and a separating base 276. In this embodiment, a plastic board is used as the separating base 276. The separating base 276 may include a molded grid and/or lattice structure on either the bottom side of the separating base 276 or on a side of the separating base 276 adjacent the capacitive touch sensor layer 274 to create an air gap layer adjacent the capacitive touch sensor layer 274. In this embodiment, the printed art layer 272 includes the capacitive touch sensor layer 274. In other embodiments, printed art layer 272 and the capacitive touch sensor layer 274 may be separate layers as described above.

FIG. 24 shows an exploded view of a doll house 280 construction with capacitive touch sensor layers 282 and a separation base 284. The capacitive touch sensor layers 282 is coupled to floor 285 and interior walls 286 of the doll house 280. by lamination, glue or similar method. The separation base 284 is coupled to outside decorative walls 289 of the doll house 280 by lamination, glue or similar method.

The separation base 284 is a cut or molded grid and/or lattice structure. The separation base 284 is coupled to the floor 285 and interior walls 286 to form an air gap layer adjacent the capacitive touch sensor layers 282. The separation base 284 mitigates the capacitive sensor sensitivity to lower the risk of false and/or unintentional capacitive sensor triggering.

Figure 24A:
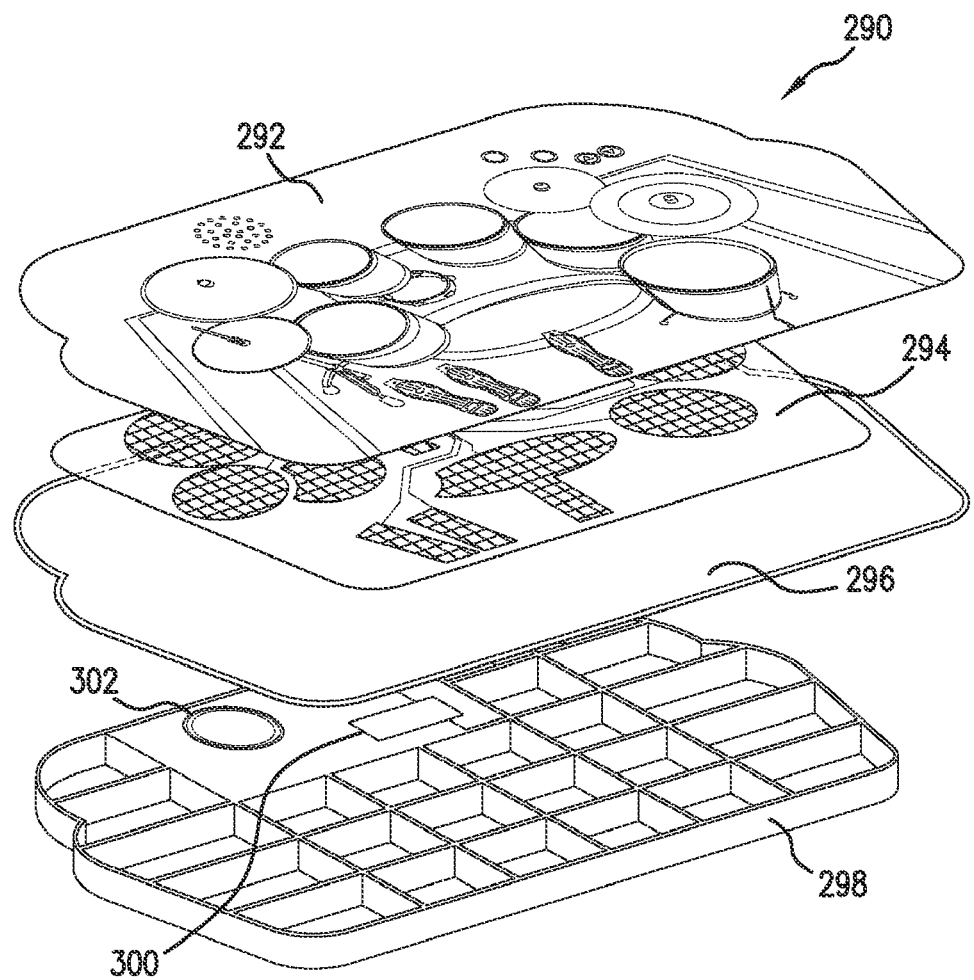
FIG. 24A illustrates drum set construction with thin film capacitive touch sensors and an air gap layer.
Figure 24B:
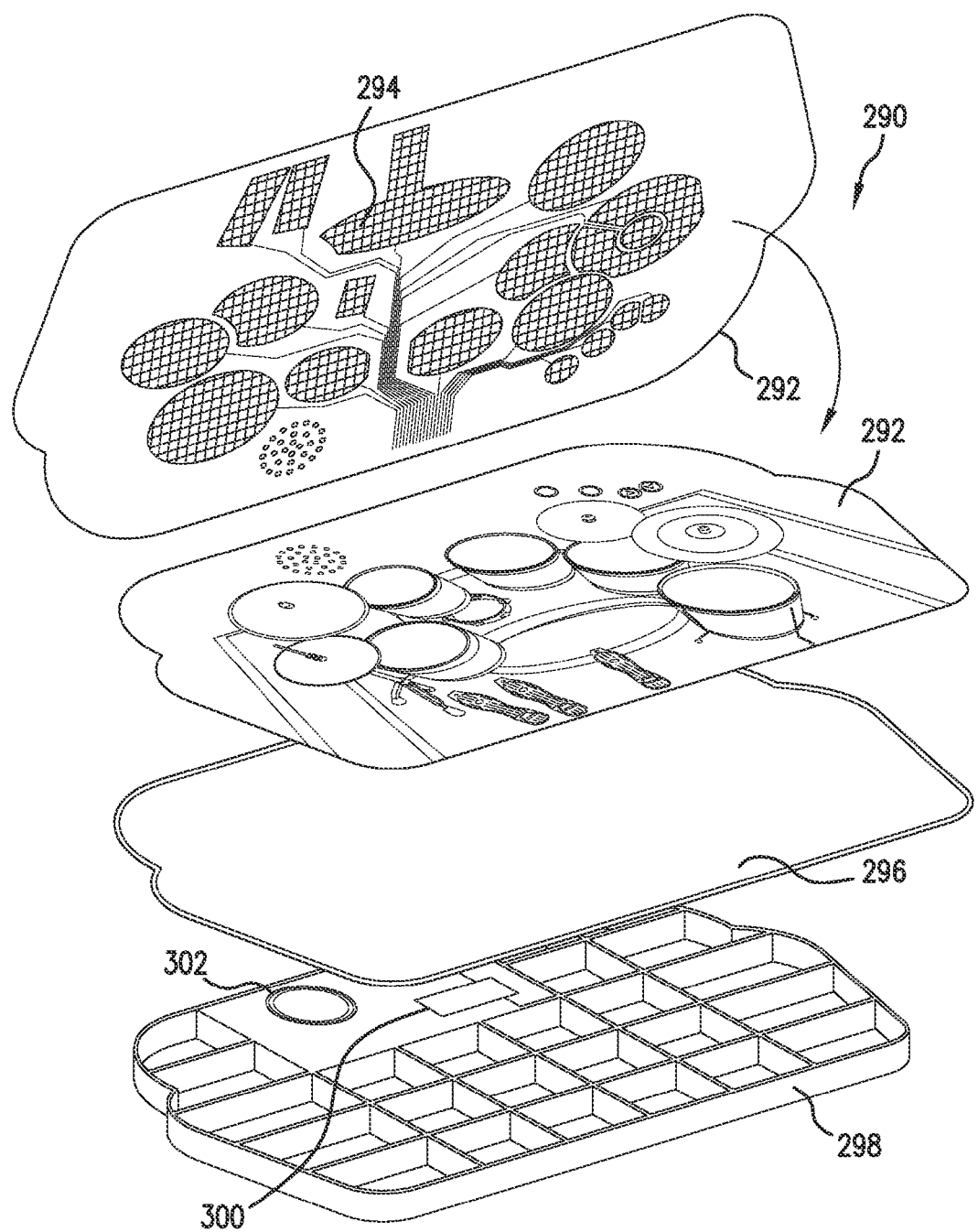
FIG. 24B illustrates drum set construction of an alternate embodiment.

FIGS. 24A and 24B illustrate a capacitive drum set 290 with a separation base. The capacitive drum set 290 has a printed art layer 292, a capacitive touch sensor layer 294, a plastic drum platform 296, a separation base 298, an electronics package 300, and a speaker 302. The separation base 298 may be constructed/molded in plastic with a lattice, corrugated or other structure formed therein to create an air-gap layer behind the capacitive touch sensor layer 294. This air gap layer will mitigate the capacitive sensor sensitivity to reduce the risk o false and/or unintentional capacitive sensor triggering. Alternately, as illustrated by FIG. 24B, the capacitive touch sensor layer 294 is combined in the printed art layer 292 with both full color printing on the front side and the screen printed capacitive elements on the backside or underside. For both embodiments, the plastic drum platform may serve as the separation layer between the capacitive touch sensor layer 294 and the separation base 298.

FIG. 31A illustrates a greeting card 310 with a separation base 316. The greeting card 310 includes a printed art layer 312 with a capacitive touch sensor layer 314 integrated therein, a card backing layer 317, and an electronics package 318. In this embodiment, the separation base 316 is molded in plastic with a lattice structure, but in other embodiments, other materials such as paper may be used and other structure geometries may be used, such as a corrugated structure, or any other structure that will create an air gap layer behind the capacitive touch sensor layer 314. The shielding of the capacitive touch sensor layer 314 is an important feature for the greeting card to function properly as a greeting card is hand held when it is operated. The inclusion of the separation base 316 creates an air gap layer behind the capacitive touch sensor layer 314 that will mitigate false and/or unintentional triggering of thin film capacitive touch sensors in the capacitive touch sensor layer 314 from the back side of the greeting card 310 when the greeting card 310 is being held.

Figure 25A:
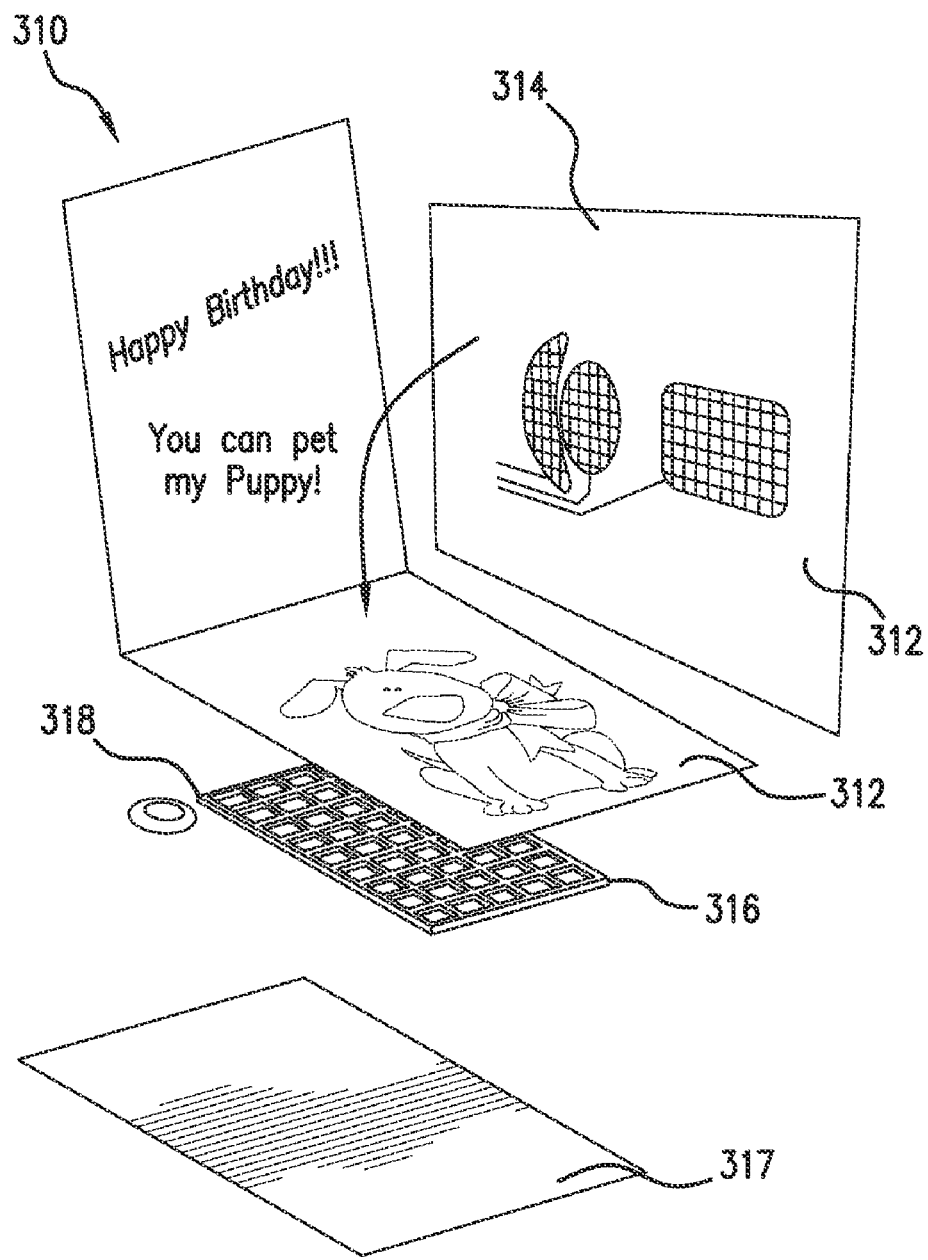
FIG. 25A illustrates greeting card construction with thin film capacitive touch sensors and an air gap layer.
Figure 25B:
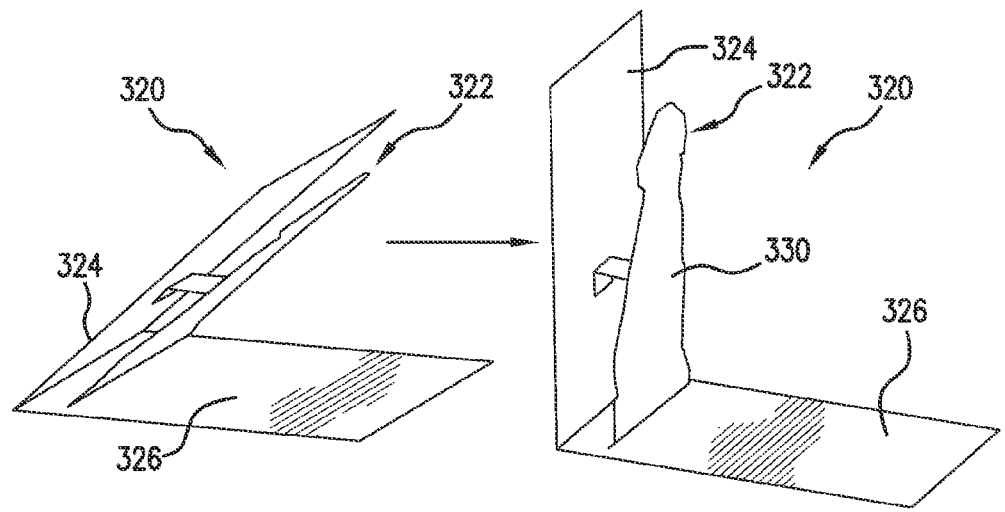
FIGS. 25B and 25C illustrate greeting card construction of an alternate embodiment with a pop-up with thin film capacitive touch sensors and an air gap layer.
Figure 25C:
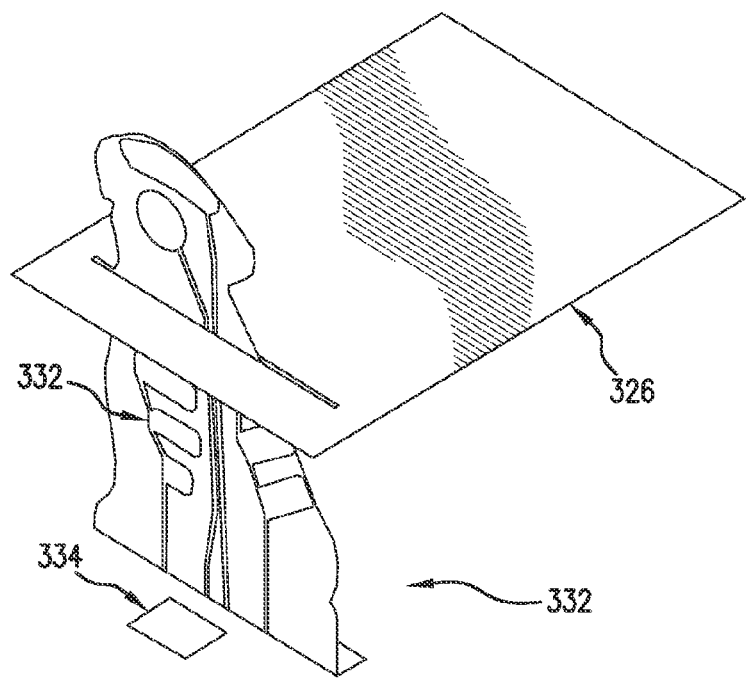

FIGS. 25B and 25C illustrate a greeting card 320 with an interactive capacitive folding pop-up 322. The greeting card 320 also has a card top 324, a card bottom 326 and an electronic package 334. The pop-up 322 comprises a printed art layer 330 and a capacitive touch sensor layer 332. In some embodiments, the capacitive touch sensor layer 332 is combined with the printed art layer 330 in a common layer. When the greeting card 320 is opened, an air gap layer 328 is created between the pop-up 322 and the card top 324. The air gap layer 328 formed behind the capacitive touch sensor layer 332 of the pop-up 322 mitigate the capacitive sensor sensitivity to false and/or unintentional capacitive sensor triggering from touches to the back of the capacitive touch sensor layer 332, in particular as the greeting card is grasped in by hand.

Figure 26A:
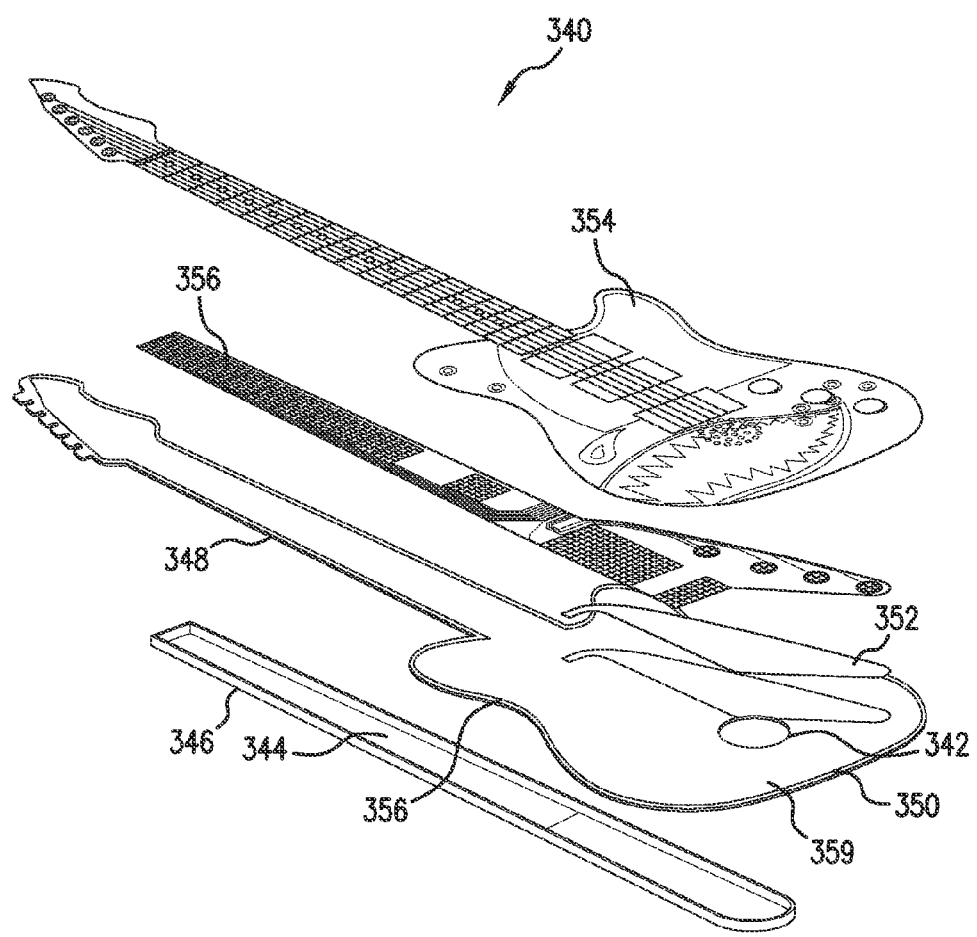
FIG. 26A illustrates a guitar construction method with thin film capacitive touch sensors and an air gap layer.

FIG. 26A illustrates a capacitive guitar 340 embodiment construction using an air gap layer 344 and a conductive ground plane layer 350. The capacitive guitar 340 also comprises a guitar body 342, a guitar neck 348, a neck housing 346, a separation layer 352, a printed art layer 354, capacitive touch sensor layer 356, an electronics package 358 and a speaker 359. In this embodiment, both the conductive ground plane layer 350 and the air gap layer 344 are used because of the product's physical design. This is possible because of the neck housing 346 creates the air gap layer 344. The conductive ground plane layer 350 doesn't have a separate housing covering the back of the entire guitar body 342, so it is mounted on the top of the guitar body 342 with separation layer 352 between it and the capacitive touch sensor layer 356.

Figure 26B:
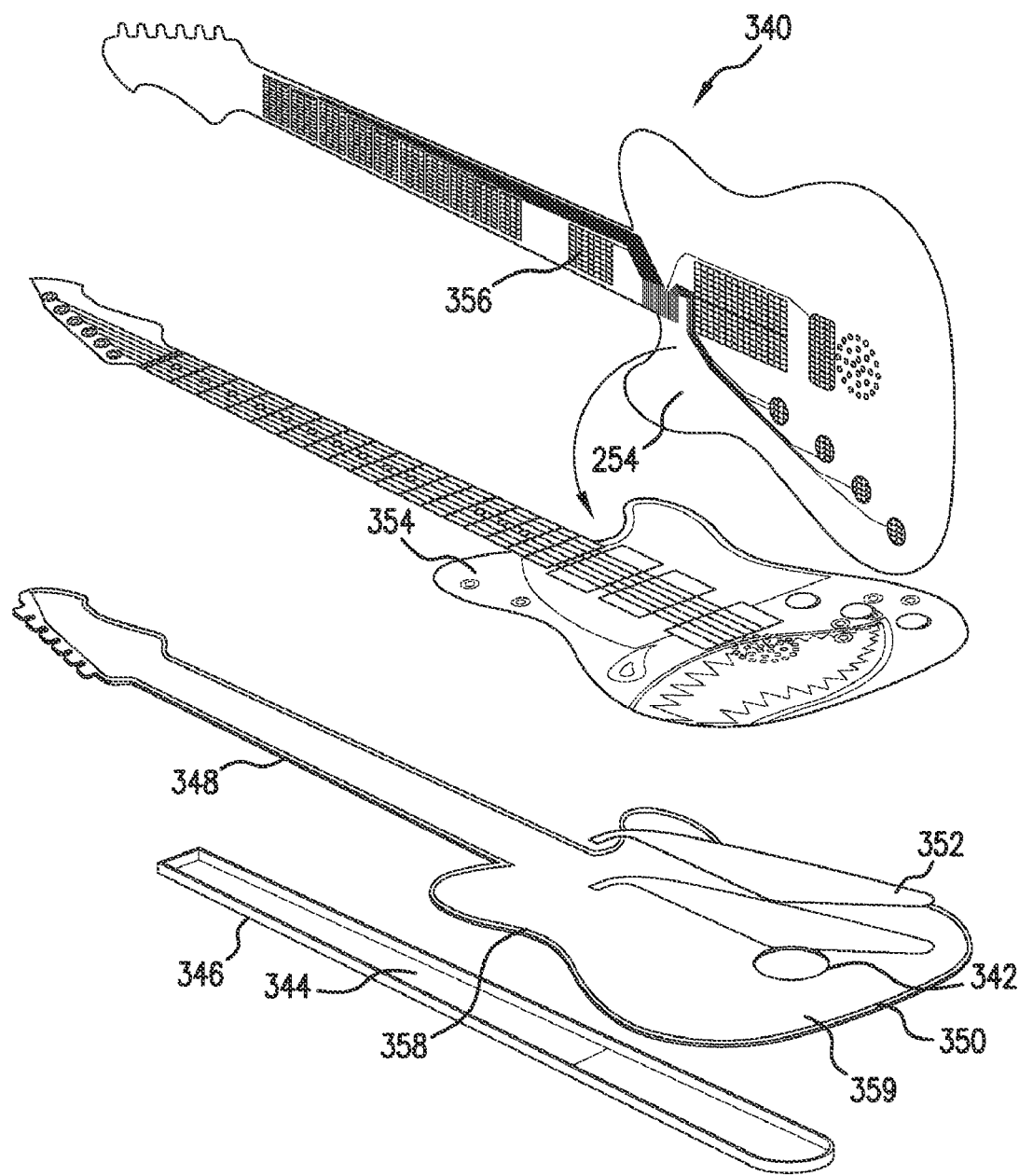
FIG. 26B. illustrates a guitar construction method of an alternate embodiment.

The air gap layer 344 provided in and/or formed by the neck housing 346 and the conductive ground plane layer 350 provided in the guitar body 342 behind the respective parts of the capacitive touch sensor layer 356 mitigate the capacitive sensor sensitivity to false and/or unintentional capacitive sensor triggering. In the embodiment shown in FIG. 26A, the printed art layer 354 and the capacitive touch sensor layer 356 are separate. In an alternate embodiment, as illustrated by FIG. 26B the capacitive touch sensor layer 356 is combined with the printed art layer 354, with thin film capacitive touch sensors screen printed or otherwise formed on the underside or backside of the printed art layer 354.

Though illustrated and described with reference to board games, greeting cards, and instruments (e.g., guitars and drums) it is to be understood that thin film capacitive touch sensors including a conductive ground plane layer shield, air gap layer shield, and/or a combination thereof, may be included in any device or product to make the device or product touch sensitive and/or touch interactive. For example, clothes (including doll clothes), fabrics, accessories, and the like may include one or more thin film capacitive touch sensors. Further, posters and other print advertising materials may include one or more thin film capacitive touch sensors.

Further, the capacitive touch sensor layer need not be a planar layer. For example, the capacitive touch sensor layer (and any ground plane shield layer and/or air gap layer) may be formed in a non-planar configuration. Further, for a substantially enclosed non-planar configuration (e.g., a bottle, can, or other container), the interior of the container may serve as the air gap layer to substantially mitigate or prevent false and/or unintentional capacitive sensor triggering.

As noted above, the thin film capacitive touch sensors may interact with any variety of electronic circuits or devices as input devices. For example, the electronic circuits or devices may include radio frequency and/or other wireless interface circuits or devices so that the electronic circuit may be remotely controlled and/or provide a wireless signal indicative of the state of the thin film capacitive touch sensors.

Those skilled in the art will recognize that numerous modifications and changes may be made to the preferred embodiment without departing from the scope of the claimed invention. It will, of course, be understood that modifications of the invention, in its various aspects, will be apparent to those skilled in the art, some being apparent only after study, others being matters of routine mechanical, chemical and electronic design. No single feature, function or property of the preferred embodiment is essential. Other embodiments are possible, their specific designs depending upon the particular application. As such, the scope of the invention should not be limited by the particular embodiments herein described but should be defined only by the appended claims and equivalents thereof.

We claim:
1. A touch sensitive sensor system comprising:
a capacitive touch sensor layer; and
an air gap layer adjacent the capacitive touch sensor layer configured to shield a backside of the capacitive touch sensor layer.

2. The touch sensitive sensor system of claim 1, the air gap layer further comprising a lattice structure, a corrugated structure, or a combination thereof to form the air gap layer adjacent the backside of the capacitive touch sensor layer.

3. The touch sensitive sensor system of claim 1, the capacitive touch sensor layer further comprising conductive ink printed on a thin film substrate.

4. The touch sensitive sensor system of claim 3, the capacitive touch sensor layer further comprising a conductive ink grid having less than complete conductive ink coverage.

5. The touch sensitive sensor system of claim 4, the conductive ink grid further having an approximately 50% or greater coverage.

6. The touch sensitive sensor system of claim 4, the conductive ink grid further having an approximately 35% or greater coverage.

7. The touch sensitive sensor system of claim 1 further comprising a printed art layer adjacent the capacitive touch sensor layer and opposite the air gap layer.

8. The touch sensitive sensor system of claim 7 wherein the capacitive touch sensor layer is integrally formed in the printed art layer.

9. The touch sensitive sensor system of claim 8, the integrally formed printed art and capacitive touch sensor layer further comprising an opaque layer disposed between the printed art and the capacitive touch sensor layer.

10. The touch sensitive sensor system of claim 1, the capacitive touch sensor layer further comprising a substantially one-sided capacitive touch sensor layer shielded by the air gap layer.

11. The touch sensitive sensor system of claim 10, the one-sided capacitive touch sensor layer to substantially prevent sensing a touch on a backside of the touch sensitive sensor system.

12. A touch sensitive sensor system comprising:
one or more capacitive touch sensor layers;
a conductive ground plane layer adjacent at least one of the capacitive touch sensor layers configured to shield a backside of the one or more capacitive touch sensor layers; and
an air gap layer adjacent at least one other capacitive touch sensor layers configured to shield a backside of the at least one other capacitive touch sensor layers.

13. The touch sensitive sensor system of claim 12 further comprising a separation layer disposed between the conductive ground plane layer and the at least one of the capacitive touch sensor layers.

14. The touch sensitive sensor system of claim 12 further comprising one or more printed art layers integrally formed with the one or more capacitive touch sensor layers.

* * * * *